United States Patent
Takahashi et al.

(10) Patent No.: US 9,435,866 B2
(45) Date of Patent: Sep. 6, 2016

(54) DEVICE AND METHOD FOR DETERMINING DETERIORATION OF SECONDARY BATTERY

(75) Inventors: Kenji Takahashi, Toyota (JP); Nobuyasu Haga, Seto (JP); Shuji Tomura, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 68 days.

(21) Appl. No.: 13/639,821

(22) PCT Filed: Apr. 9, 2010

(86) PCT No.: PCT/JP2010/056415
§ 371 (c)(1), (2), (4) Date: Oct. 5, 2012

(87) PCT Pub. No.: WO2011/125213
PCT Pub. Date: Oct. 13, 2011

(65) Prior Publication Data
US 2013/0030739 A1    Jan. 31, 2013

(51) Int. Cl.
*G01R 31/36* (2006.01)
(52) U.S. Cl.
CPC ....... *G01R 31/3679* (2013.01); *G01R 31/3658* (2013.01); *G01R 31/3651* (2013.01); *G01R 31/3655* (2013.01); *G01R 31/3662* (2013.01)
(58) Field of Classification Search
CPC .............. G01R 31/36; G01R 31/3662; G01R 31/3627; G01R 31/3679; H01M 10/42; H01M 10/4207; H01M 10/4285; H01M 10/48; H01M 10/482; H01M 10/4292; Y04S 10/14; Y04S 320/21; Y02E 60/12; Y02E 60/122

USPC .......................................................... 702/63
See application file for complete search history.

(56) References Cited

U.S. PATENT DOCUMENTS

| | | | |
|---|---|---|---|
| 8,615,372 B2 * | 12/2013 | Tomura et al. | 702/63 |
| 8,825,417 B1 * | 9/2014 | Krolak et al. | 702/63 |
| 2008/0040056 A1 * | 2/2008 | Lee | 702/63 |
| 2008/0255783 A1 * | 10/2008 | Tamai | 702/63 |
| 2009/0070052 A1 * | 3/2009 | Taniguchi et al. | 702/63 |

(Continued)

FOREIGN PATENT DOCUMENTS

| | | |
|---|---|---|
| JP | A-06-089745 | 3/1994 |
| JP | A-2003-107139 | 4/2003 |

(Continued)

OTHER PUBLICATIONS

Kobayashi et al., machine translation of JP2009-244088.*

*Primary Examiner* — Gregory J Toatley
*Assistant Examiner* — Terence Stifter, Jr.
(74) *Attorney, Agent, or Firm* — Oliff PLC

(57) ABSTRACT

A secondary battery is implemented as an assembly of a plurality of battery modules. An ECU calculates a deterioration indicator quantitatively indicating a degree of deterioration of a battery module for each of the plurality of battery modules, and detects as a module to be replaced, a battery module of which deterioration indicator has reached a prescribed replacement level. The ECU further extracts a module to additionally be replaced, which should be replaced simultaneously with the module to be replaced above, from battery modules of which deterioration indicator has not reached the replacement level, among the plurality of battery modules.

13 Claims, 18 Drawing Sheets

(56) References Cited

U.S. PATENT DOCUMENTS

| | | |
|---|---|---|
| 2010/0153038 A1 | 6/2010 | Tomura et al. |
| 2010/0156351 A1* | 6/2010 | Ugaji et al. ............ 320/132 |
| 2010/0198536 A1* | 8/2010 | Hess .................... 702/63 |
| 2010/0256935 A1* | 10/2010 | Imanishi et al. ........ 702/63 |
| 2011/0218703 A1* | 9/2011 | Uchida ................. 701/33 |
| 2012/0215472 A1* | 8/2012 | Tezuka et al. .......... 702/63 |

FOREIGN PATENT DOCUMENTS

| | | |
|---|---|---|
| JP | A-2006-197765 | 7/2006 |
| JP | A-2007-195312 | 8/2007 |
| JP | A-2008-241246 | 10/2008 |
| JP | A-2009-080104 | 4/2009 |
| JP | 2009244088 A * | 10/2009 |
| JP | A-2011-220917 | 11/2011 |

\* cited by examiner

DEVICE AND METHOD FOR DETERMINING DETERIORATION OF SECONDARY BATTERY

TECHNICAL FIELD

This invention relates to a device and a method for determining deterioration of a secondary battery and more particularly to deterioration diagnosis for determining on-board whether or not a secondary battery should be replaced.

BACKGROUND ART

A secondary battery has been known to deteriorate as it is repeatedly charged and discharge for use. Therefore, it is important to diagnose deterioration on-board in parallel to use of the secondary battery.

For example, Japanese Patent Laying-Open No. 6-89745 (PTL 1) describes a secondary battery system calculating by estimation the number of remaining charge and discharge cycles of a secondary battery. According to PTL 1, in a battery group constituted of a plurality of secondary batteries connected in series, a remaining cycle life is estimated based on the number of cycles until a set value is reached, by extrapolating a discharge capacity for each cycle or a rate of change in voltage at the time when discharging ends.

In addition, Japanese Patent Laying-Open No. 2006-197765 (PTL 2) describes pricing of a moving vehicle incorporating an electric drive device represented by a secondary battery. According to PTL 2, an ECU (Electronic Control Unit) calculates and stores a deterioration estimation parameter on-board based on data of history of use of a main battery. Then, a deterioration parameter is output from the ECU through a connector and a transmitter to a deterioration estimation device outside a vehicle. The deterioration estimation device estimates a state of deterioration and a remaining life of a battery based on the read deterioration estimation parameter and assesses value of the secondary battery based on this result of estimation.

Japanese Patent Laying-Open No. 2007-195312 (PTL 3) describes a secondary battery life estimation device for estimating a remaining life, which is suitable for a secondary battery mounted on a vehicle. According to PTL 3, a correlation function is determined so as to have a high correlation value with stored full charge capacities or internal resistances of the secondary battery. The correlation function is defined as a linear function having a square root of a total travel distance of a vehicle as a variable and determined by using a least squares method, or the like. Then, a point where the determined correlation function intersects with a life determination line is determined as the life and a travel distance until that life is estimated as a remaining life.

Furthermore, Japanese Patent Laying-Open No. 2008-241246 (PTL 4) describes a technique for diagnosing deterioration of a secondary battery on-line. According to PTL 4, with regard to a parameter in, a battery model equation, a characteristic map in connection with change in new-state parameter value with change in battery state is stored. During use of the secondary battery, a parameter is identified based on the battery model equation. Then, a degree of deterioration of the secondary battery is diagnosed based on a ratio (a rate of change) between the identified parameter value and the new-state parameter value which corresponds to a current state of the battery.

CITATION LIST

Patent Literature

PTL 1: Japanese Patent Laying-Open No. 6-89745
PTL 2: Japanese Patent Laying-Open No. 2006-197765
PTL 3: Japanese Patent Laying-Open No. 2007-195312
PTL 4: Japanese Patent Laying-Open No. 2008-241246

SUMMARY OF INVENTION

Technical Problem

In order to secure a necessary output voltage or a stored amount of electric power, a secondary battery may be used in a form of an assembly of a plurality of cells. For example, a battery pack implemented as an assembly of battery packs constituted of a plurality of battery cells is employed as a power supply for driving a motor in an electrically powered vehicle such as an electric car or a hybrid car. In such a case, since a price of the battery pack as a whole is high, battery replacement with suppressed cost can be realized by replacing only a part of the battery pack. For example, it is possible that a battery pack is implemented by a plurality of battery modules and battery replacement is carried out module by module.

According to PTLs 1 to 4, deterioration can be diagnosed during use of a secondary battery (on-board). Therefore, whether or not a secondary battery being used should be replaced can be determined based on a result of on-board diagnosis. PTLs 1 to 4, however, are silent about deterioration determination for efficient module-by-module battery replacement in a secondary battery implemented by a plurality of modules.

This invention was made to solve such problems, and an object of this invention is to make deterioration determination enabling more efficient battery replacement for each battery module in a secondary battery implemented as an assembly of a plurality of battery modules.

Solution to Problem

One aspect of this invention is directed to a device for determining deterioration of a secondary battery implemented as an assembly of a plurality of battery modules, and the device includes a deterioration diagnosis unit, a detection unit, and an extraction unit. The deterioration diagnosis unit is configured to calculate a deterioration indicator quantitatively indicating a degree of deterioration of a battery module for each battery module. The detection unit is configured to detect a first battery module to be replaced, from among the plurality of battery modules, based on comparison between the deterioration indicator calculated by the deterioration diagnosis unit and a prescribed replacement level. The extraction unit is configured to extract, when the detection unit detects the first battery module, a third battery module to be replaced simultaneously with the first battery module, from second battery modules of which deterioration indicator has not yet reached the replacement level, among the plurality of battery modules.

Preferably, the device for determining deterioration of a secondary battery further includes a remaining life estimation unit. The remaining life estimation unit is configured to estimate a remaining life until the deterioration indicator reaches the replacement level based on the deterioration indicator calculated by the deterioration diagnosis unit, for each battery module. Then, the extraction unit extracts as the third battery module, the second battery module among the plurality of battery modules, when the estimated remaining life is shorter than a prescribed criterion value.

Further preferably, the deterioration diagnosis unit calculates a plurality of deterioration indicators for each battery module. Then, the remaining life estimation unit estimates a plurality of remaining lives in correspondence with the plurality of deterioration indicators respectively, for the second battery module, and carries out extraction as the third battery module when a minimum value among the plurality of estimated remaining lives is shorter than the criterion value.

For example, the deterioration indicator includes an internal resistance of each battery module. Alternatively, the deterioration indicator includes a full charge capacity of each battery module. Alternatively, the plurality of deterioration indicators include an internal resistance and a full charge capacity of each battery module.

Alternatively, preferably, the secondary battery is a lithium ion secondary battery, and the deterioration diagnosis unit includes a deterioration parameter obtaining unit and a lithium deposition amount estimation unit. The deterioration parameter obtaining unit is configured to obtain a positive electrode capacity retention ratio, a negative electrode capacity retention ratio, and a battery capacity fluctuation amount of the lithium ion secondary battery through deterioration diagnosis based on open-circuit voltage characteristics indicating change in open-circuit voltage with change in capacity of the lithium ion secondary battery. The lithium deposition amount estimation unit is configured to separate the obtained battery capacity fluctuation amount into a first fluctuation amount and a second fluctuation amount corresponding to deterioration due to deposition of lithium based on the obtained positive electrode capacity retention ratio and negative electrode capacity retention ratio, in accordance with correspondence found in advance between the positive electrode capacity retention ratio, the negative electrode capacity retention ratio and the first fluctuation amount corresponding to age-related deterioration in the battery capacity fluctuation amount. Then, the deterioration indicator includes the second fluctuation amount of each battery module. Alternatively, the plurality of deterioration indicators include the second fluctuation amount and at least one of an internal resistance and a full charge capacity of each battery module.

Preferably, the device for determining deterioration of a secondary battery further includes a guidance information generation unit. The guidance information generation unit is configured to evaluate which of replacement of the entire assembly and partial replacement of only the first and third battery modules is more advantageous in terms of cost, in accordance with a total number of the detected first battery modules and the extracted third battery modules.

According to another aspect of this invention, a method of determining deterioration of a secondary battery implemented as an assembly of a plurality of battery modules includes the steps of calculating a deterioration indicator quantitatively indicating a degree of deterioration of a battery module for each battery module, detecting a first battery module to be replaced, from among the plurality of battery modules, based on comparison between the calculated deterioration indicator and a prescribed replacement level, and extracting, when the first battery module is detected, a third battery module to be replaced simultaneously with the first battery module, from second battery modules of which deterioration indicator has not yet reached the replacement level, among the plurality of battery modules.

Preferably, the step of extracting includes the steps of estimating a remaining life until the deterioration indicator reaches the replacement level based on the deterioration indicator calculated in the step of calculating, for each battery module, and extracting as the third battery module, the second battery module among the plurality of battery modules, when the estimated remaining life is shorter than a prescribed criterion value.

Further preferably, in the step of calculating, a plurality of deterioration indicators are calculated for each battery module. In the step of estimating, a plurality of remaining lives in correspondence with the plurality of deterioration indicators are estimated respectively, for the second battery module. Then, in the step of extracting, extraction as the third battery module is carried out when a minimum value among the plurality of estimated remaining lives is shorter than the criterion value.

For example, the deterioration indicator includes an internal resistance of each battery module. Alternatively, the deterioration indicator includes a full charge capacity of each battery module. Alternatively, the plurality of deterioration indicators include an internal resistance and a full charge capacity of each battery module.

In addition, preferably, the secondary battery is a lithium ion secondary battery. The step of calculating includes the steps of obtaining a positive electrode capacity retention ratio, a negative electrode capacity retention ratio, and a battery capacity fluctuation amount of the lithium ion secondary battery through deterioration diagnosis based on open-circuit voltage characteristics indicating change in open-circuit voltage with change in capacity of the lithium ion secondary battery, and separating the obtained battery capacity fluctuation amount into a first fluctuation amount and a second fluctuation amount corresponding to deterioration due to deposition of lithium based on the obtained positive electrode capacity retention ratio and negative electrode capacity retention ratio, in accordance with correspondence found in advance between the positive electrode capacity retention ratio, the negative electrode capacity retention ratio and the first fluctuation amount corresponding to age-related deterioration in the battery capacity fluctuation amount. Then, the deterioration indicator includes the second fluctuation amount of each battery module. Alternatively, the plurality of deterioration indicators include the second fluctuation amount and at least one of an internal resistance and a full charge capacity of each battery module.

Preferably, the method of determining deterioration of a secondary battery further includes the step of evaluating which of replacement for each and partial replacement of only the first and third battery modules is more advantageous in terms of cost, in accordance with a total number of the detected first battery modules and the extracted third battery modules.

Advantageous Effects of Invention

According to this invention, deterioration determination for enabling more efficient battery replacement for each battery module in a secondary battery implemented as an assembly of a plurality of battery modules can be made.

DESCRIPTION OF EMBODIMENTS

Figure 1:
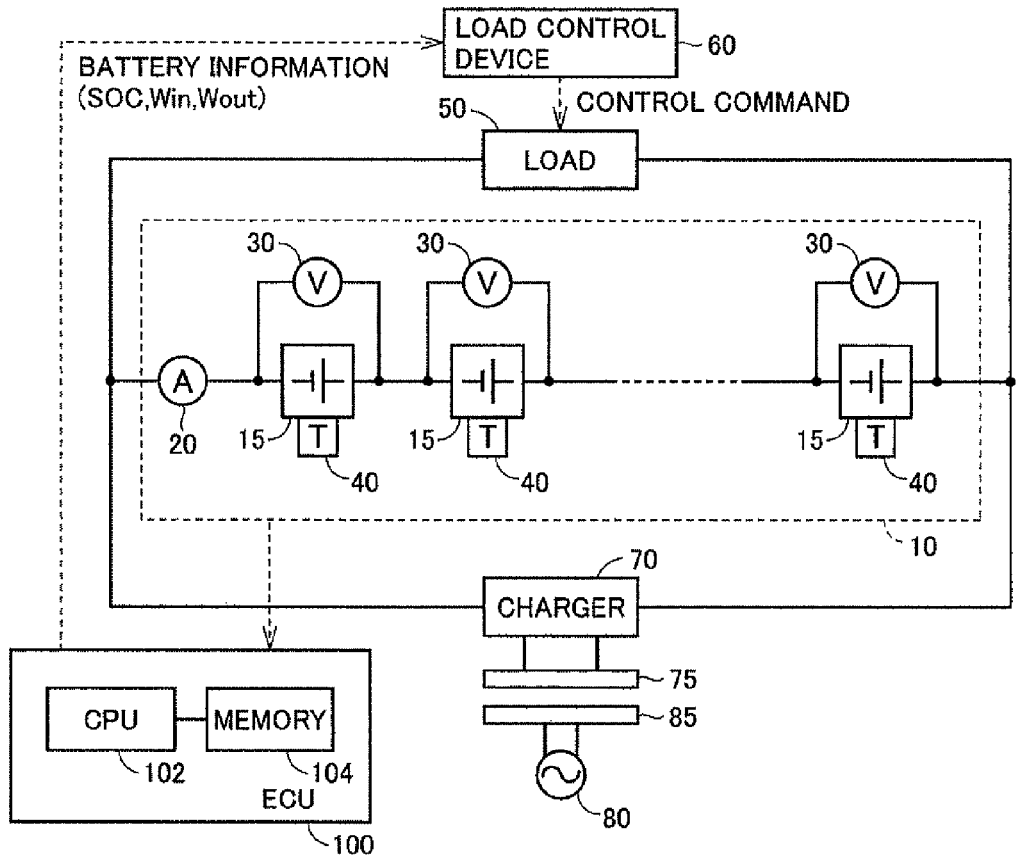
FIG. 1 is a block diagram showing a schematic configuration of a power supply system having a secondary battery as a power supply, to which secondary battery deterioration determination according to an embodiment of the present invention is applied.

An embodiment of the present invention will be described hereinafter in detail with reference to the drawings. It is noted that the same or corresponding elements in the drawings have the same reference characters allotted and description thereof will not be repeated in principle.

First Embodiment

In a first embodiment, a basic concept of determination of deterioration of a secondary battery according to an embodiment of the present invention will be described.

FIG. 1 is a block diagram showing a schematic configuration of a power supply system having a secondary battery as a power supply, to which secondary battery deterioration determination according to the embodiment of the present invention is applied.

Referring to FIG. 1, a secondary battery 10 supplies electric power for driving a load 50. Load 50 is implemented, for example, by a traction motor, which is mounted on an electrically powered vehicle such as an electric car, a hybrid car, or the like. In addition, load 50 charges secondary battery 10 with regenerative electric power from a motor. Secondary battery 10 is implemented, for example, by a nickel metal hydride secondary battery or a lithium ion secondary battery.

Secondary battery 10 is implemented as an assembly of a plurality of battery modules 15 connected to one another. Each battery module 15 is provided with a voltage sensor 30 and a temperature sensor 40. It is noted that, since battery modules 15 are connected in series in the example in FIG. 1, a current sensor 20 common to the battery modules is arranged.

In the following, a measurement value from current sensor 20 is denoted also as a battery current Ib, a measurement value from voltage sensor 30 is denoted also as a battery voltage Vb, and a measurement value from temperature sensor 40 is denoted also as a battery temperature Tb. In addition, data obtained by the sensors, such as battery current Ib, battery voltage Vb, and battery temperature Tb, is also collectively referred to as "battery data".

As can be understood from FIG. 1, battery current Ib, battery voltage Vb, and battery temperature Tb are detected for each battery module 15. Namely, in the present embodiment, deterioration is diagnosed individually for each battery module 15, based on battery data. In the present embodiment, battery module 15 represents a unit of which deterioration indicator indicating a degree of battery deterioration can independently be calculated based on the battery data. Battery module 15 may be implemented by a single battery cell or by a plurality of connected battery cells.

A power supply system can also be in such a configuration that secondary battery 10 is chargeable by an external power supply 80 by further providing a charger 70 and a charge connector 75. By connecting a charge plug 85 connected to external power supply 80 and charge connector 75 connected to charger 70 to each other, electric power from external power supply 80 is supplied to charger 70. Charger 70 is configured to convert electric power supplied from external power supply 80 to electric power for charging secondary battery 10.

An ECU 100 corresponds to a device for determining deterioration of a secondary battery according to the present embodiment. ECU 100 includes a CPU 102, a memory 104, an A/D converter and a D/A converter which are not shown, and the like. ECU 100 can perform prescribed operation processing using an input signal and data from sensors and the like by executing a prescribed program stored in memory 104 in advance.

ECU 100 generates battery information on secondary battery 10 on-board based on the battery data during use of secondary battery 10. The battery information includes SOC (State of charge) indicating in percentage, a currently remaining capacity with respect to a full charge capacity. In addition, ECU 100 sets an input electric power upper limit value Win and an output electric power upper limit value Wout of secondary battery 10 as the battery information. Input electric power upper limit value Win and output electric power upper limit value Wout are set, for example, based on estimated SOC, battery temperature Tb, or the like.

A load control device 60 generates a control command for controlling a state of drive of load 50 based on the battery information. For example, when SOC of the secondary battery has lowered, such a control command as restricting electric power used by load 50 is generated. In contrast, when SOC of secondary battery 10 increases, such a control command as suppressing generation of regenerative electric power by load 50 is generated.

The ECU diagnoses deterioration on-board for each battery module 15 based on the battery data during use of secondary battery 10.

In the following, determination of deterioration of a secondary battery according to the embodiment of the present invention which is made by ECU 100 will be described in detail.

Figure 2:
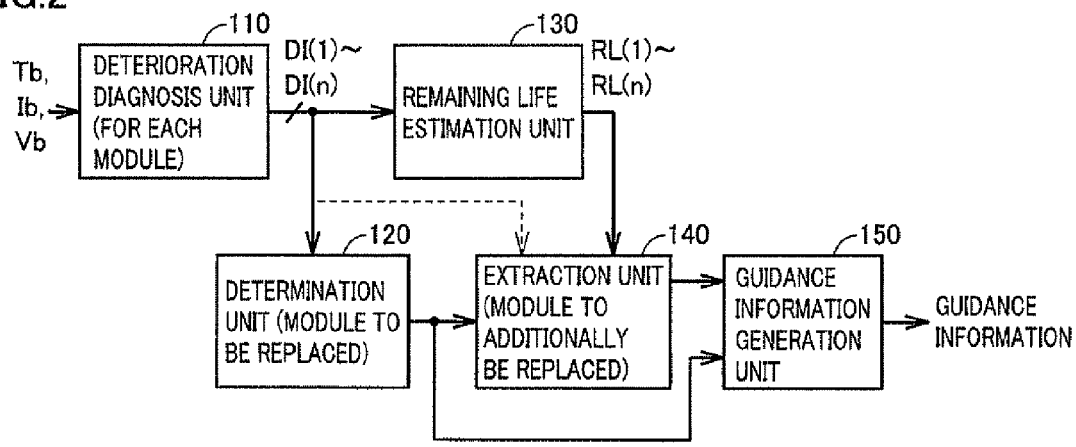
FIG. 2 is a functional block diagram for illustrating secondary battery deterioration determination according to the present embodiment.

FIG. 2 is a functional block diagram for illustrating secondary battery deterioration determination according to the present embodiment. Each functional block shown in FIG. 2 can be realized, for example, as ECU 100 executes a program stored in advance as a sub routine.

Referring to FIG. 2, a deterioration diagnosis unit 110 calculates a deterioration indicator DI for each battery module 15 based on a result of deterioration diagnosis for each battery module 15 based on the battery data. Here, it is assumed that deterioration indicators DI(1) to DI(n) are calculated for n (n: an integer not smaller than 2) battery modules 15, respectively. For example, deterioration indicator DI includes a full charge capacity (FIG. 3) or an internal resistance (FIG. 4) which will be described below.

Figure 3:
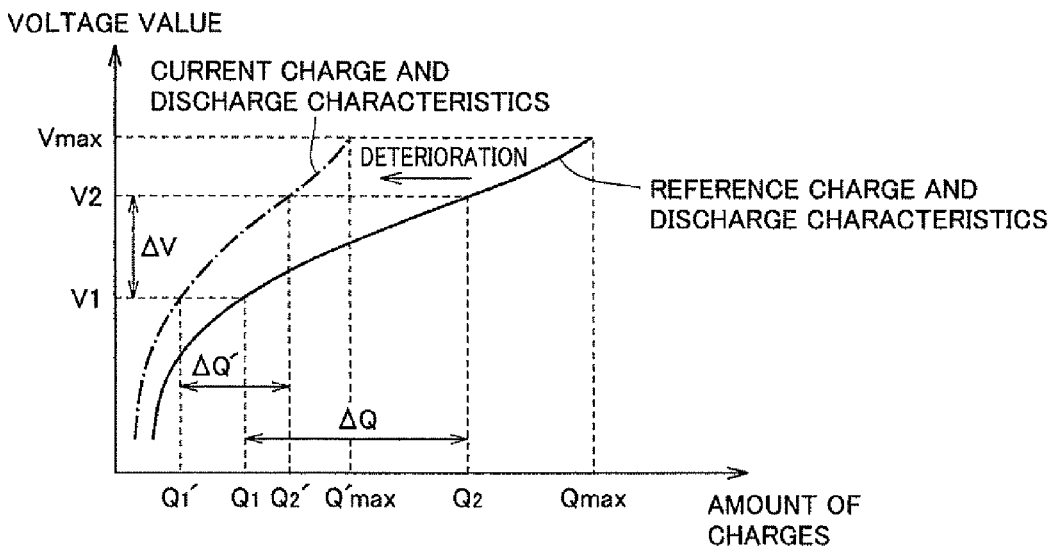
FIG. 3 is a conceptual diagram illustrating deterioration of a full charge capacity in a secondary battery.

Referring to FIG. 3, ECU 100 stores reference charge and discharge characteristics (a solid line) determined experimentally in advance. These reference charge and discharge characteristics show relation between an amount of charges in a reference state of a secondary battery (each battery module 15) and a voltage value (an open-circuit voltage). Among the reference charge and discharge characteristics, an amount of charges Qmax corresponding to a maximum voltage value Vmax corresponds to the "full charge capacity" in the reference state.

As deterioration of the secondary battery (battery module 15) proceeds, the reference charge and discharge characteristics shown in FIG. 3 are in such a shape as "shrunk" in a direction of the abscissa. In FIG. 3, one example of current charge and discharge characteristics (a chain dotted line) of the secondary battery of which deterioration has proceeded to some extent is shown. In the current charge and discharge characteristics, as deterioration proceeds, an amount of charges, at which maximum voltage value Vmax is attained, that is, which corresponds to the full charge capacity, has lowered to Q'max. Change in amount of charges can be found by integrating battery currents Ib.

Therefore, such a detection value that a full charge capacity at the current time point is Q'max can be employed as deterioration indicator DI. It is noted that change in full charge capacity can be found without necessarily setting the secondary battery to a full-charge state.

As shown in FIG. 3, an amount of charges in the case where a voltage value of battery module 15 has increased from V1 to V2 is $\Delta Q$ (=Q2−Q1) with the reference charge and discharge characteristics, while it is $\Delta Q'$ (=Q2'−Q1') with the current charge and discharge characteristics. Here, the current charge and discharge characteristics can be regarded as the whole reference charge and discharge characteristics being shrunk at a prescribed ratio in a direction of the abscissa (a direction of an axis of an amount of charges). Namely, a relational expression of $\Delta Q:\Delta Q'=\Delta Qmax:\Delta Q'max$ holds. Consequently, ECU 100 can derive the full charge capacity as Q'max $\Delta Qmax \times \Delta Q'/\Delta Q$ in accordance with the relational expression above, by calculating $\Delta Q'$ by integrating battery currents Ib.

Figure 4:
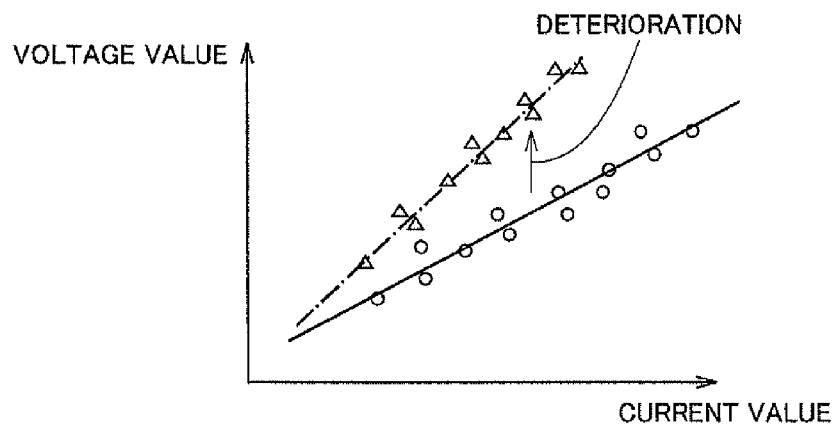
FIG. 4 is a conceptual diagram illustrating deterioration of an internal resistance in the secondary battery.

Referring to FIG. 4, an internal resistance value of the secondary battery (each battery module 15) can be derived based on a voltage value and a current value detected during a period in which a current flows in the secondary battery. The internal resistance value is present owing to a material for a positive electrode, a material for a negative electrode, or the like, and it increases with deterioration of the secondary battery. Specifically, the internal resistance value can be derived based on a ratio between voltage lowering caused by flow of a current (a charge current or a load current) in the secondary battery (each battery module 15) and a current value corresponding to that voltage lowering.

ECU 100 obtains battery voltage Vb (voltage value) from voltage sensor 30 and battery current Ib (current value) from current sensor 20 during a period in which a current flows in the secondary battery (each battery module 15). Then, after ECU 100 obtains battery voltage Vb and battery current Ib a plurality of times, ECU 100 derives a linear function for current values such that a correlation value thereof is highest. This "inclination" of the derived linear function corresponds to the internal resistance value. As the battery deteriorates, the internal resistance value increases. Therefore, as shown in FIG. 4, inclination of the linear function becomes great.

Referring again to FIG. 2, a detection unit 120 detects a battery module of which replacement is required (hereinafter also referred to as a "module to be replaced") based on comparison between deterioration indicators DI(1) to DI(n) of respective battery modules 15 and a prescribed replacement level.

Figure 5:
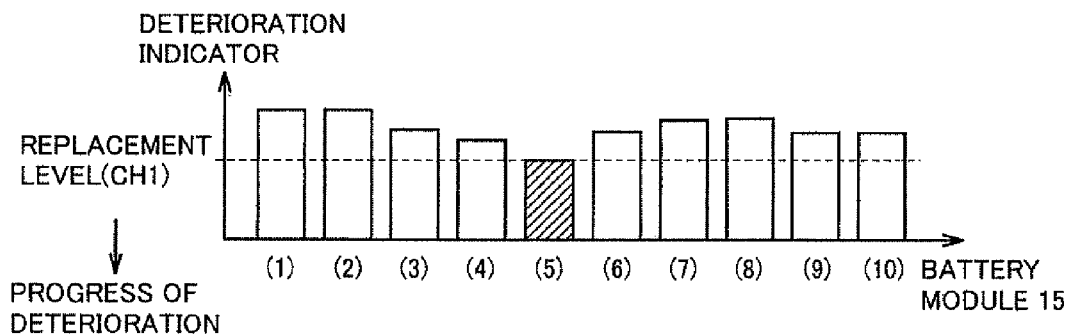
FIG. 5 is a probability diagram illustrating a function of a detection unit shown in FIG. 2.

Referring to FIG. 5, when deterioration indicator DI has reached a replacement level CH1 in any battery module 15, detection unit 120 detects that battery module as a module to be replaced. In the example in FIG. 5, among battery modules 15(1) to (10), battery module 15(5) has deteriorated to the replacement level. Consequently, battery module 15(5) is detected as the module to be replaced.

Thus, the module to be replaced is a battery module of which deterioration has proceeded to a level requiring replacement in view of deterioration indicator DI, among a plurality of battery modules 15, and it corresponds to a "first battery module."

Referring again to FIG. 2, a remaining life estimation unit 130 calculates estimated remaining life values RL(1) to RL(n) of the plurality of battery modules 15 based on deterioration indicators DI(1) to DI(n) calculated by deterioration diagnosis unit 110, respectively. Each of estimated remaining life values RL(1) to RL(n) is a parameter quantitatively indicating a length until deterioration indicator DI reaches the replacement level for each battery module 15.

When a module to be replaced is detected by detection unit 120, an extraction unit 140 extracts a battery module to be replaced simultaneously with the module to be replaced (hereinafter also referred to as a "module to additionally be replaced") among battery modules other than that. Namely, extraction unit 140 extracts as the module to additionally be replaced, a battery module which is expected to deteriorate to the replacement level in the near future, from among battery modules of which deterioration indicator D1 has not yet reached the replacement level (corresponding to "second battery modules") among the plurality of battery modules 15. Namely, the module to additionally be replaced corresponds to a "third battery module." A module to additionally be replaced can be extracted based on deterioration indicators DI(1) to DI(n) or estimated remaining life values RL(1) to RL(n).

Figure 6:
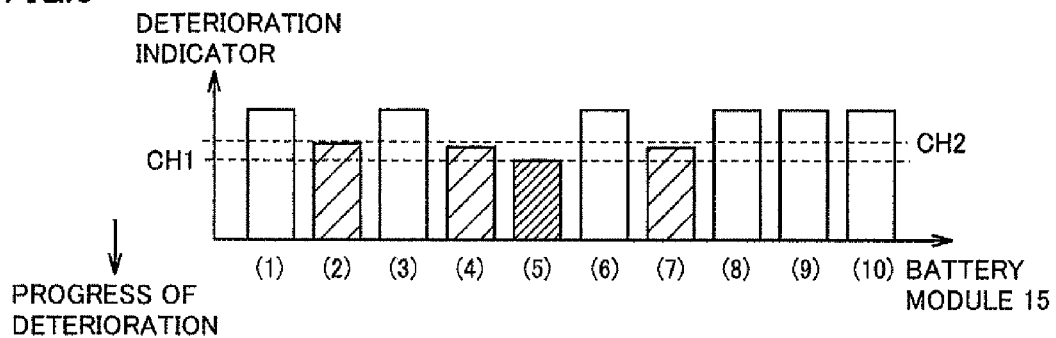
FIG. 6 is a probability diagram illustrating a function of an extraction unit shown in FIG. 2.

Referring to FIG. 6, when battery module 15(5) is detected as the module to be replaced, extraction unit 140 extracts a module to additionally be replaced which should be replaced simultaneously with module to be replaced 15(5) from among other battery modules 15(1) to (4) and 15(6) to (10).

For example, as shown in FIG. 6, battery modules 15(2), (4), and (7) of which deterioration indicator DI has reached a preliminary replacement level CH2 although not yet reached replacement level CH1 are extracted as modules to additionally be replaced.

Referring again to FIG. 2, a guidance information generation unit 150 outputs guidance information on battery replacement based on outputs from detection unit 120 and extraction unit 140. The guidance information includes information for specifying a module to be replaced detected by detection unit 120 and a module to additionally be replaced extracted by extraction unit 140. In addition, the guidance information may include a result of evaluation of cost for battery replacement based on the total number of modules to be replaced and modules to additionally be replaced. For example, information on comparison of cost between replacement only of some battery modules 15, i.e., the modules to be replaced and the modules to additionally be replaced, and replacement of the entire secondary battery 10 is included in the guidance information.

Figure 7:
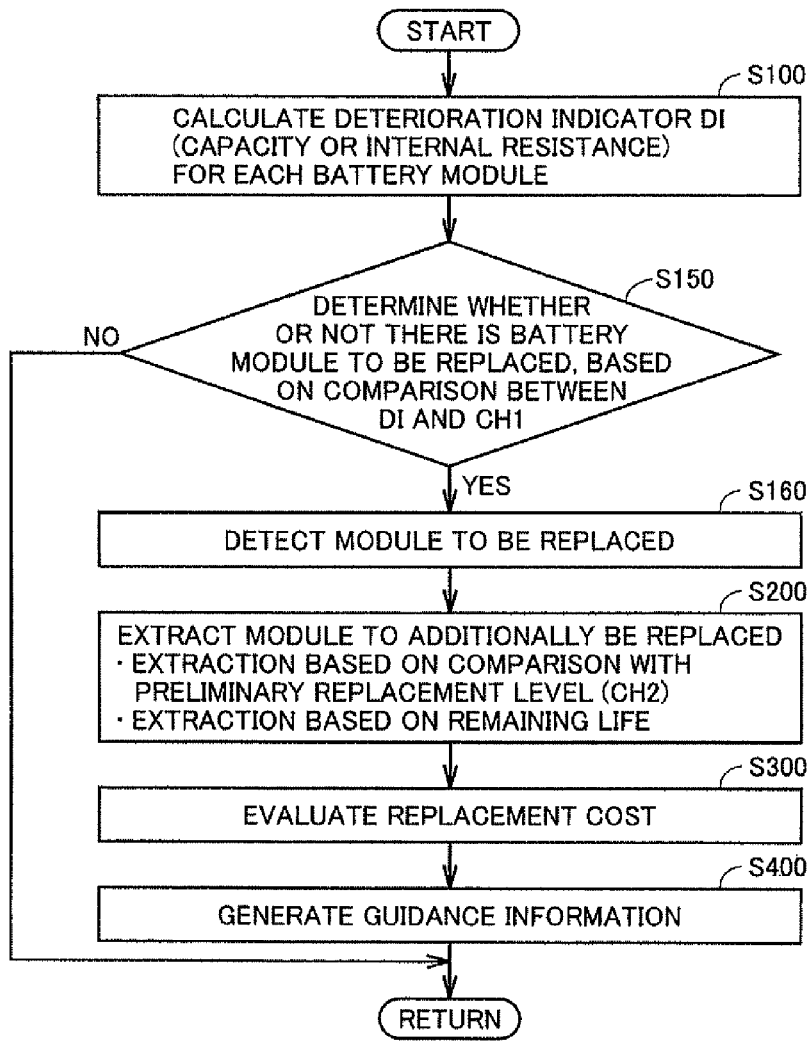
FIG. 7 is a flowchart illustrating a processing procedure for secondary battery deterioration determination according to the embodiment of the present invention.

FIG. 7 is a flowchart illustrating a processing procedure for secondary battery deterioration determination according to the embodiment of the present invention. A series of control processes shown in FIG. 7 is realized as ECU 100 starts up in a certain cycle, a prescribed program stored in advance.

Referring to FIG. 7, ECU 100 calculates in a step S100 a full charge capacity or an internal resistance of the secondary battery as deterioration indicator DI. As described above, deterioration indicator DI is calculated for each battery module 15. The processing in step S100 corresponds to the function of deterioration diagnosis unit 110 in FIG. 2.

In addition, ECU 100 detects in a step S150 a module to be replaced from among the plurality of battery modules 15 based on comparison between deterioration indicator DI calculated in step S100 and replacement level CH1. It is noted that, when deterioration indicator DI of none of battery modules 15 has reached the replacement level (CH1) (determination as NO is made in S150), ECU 100 skips subsequent steps and ends the process.

On the other hand, when deterioration indicator DI of any of the plurality of battery modules 15 has exceeded replacement level CH1 (determination as YES is made in S150), ECU 100 proceeds to step S160 and specifies the module to be replaced. Namely, the processing in steps S150, S160 corresponds to the function of detection unit 120 in FIG. 2.

In addition, ECU 100 extracts a module to additionally be replaced in a step S200. For example, in step S200, as shown in FIG. 6, preliminary replacement level CH2 lower in degree of deterioration than replacement level CH1 is compared with deterioration indicator DI. Then, battery module 15 of which deterioration indicator DI has reached preliminary replacement level CH2 although not yet reached replacement level CH1 is extracted as the module to additionally be replaced. The processing in step S200 corresponds to the function of extraction unit 140 in FIG. 2.

Alternatively, a module to additionally be replaced can be extracted in step S200 also in accordance with estimation of a remaining life based on deterioration indicator DI for each battery module 15.

Figure 8:
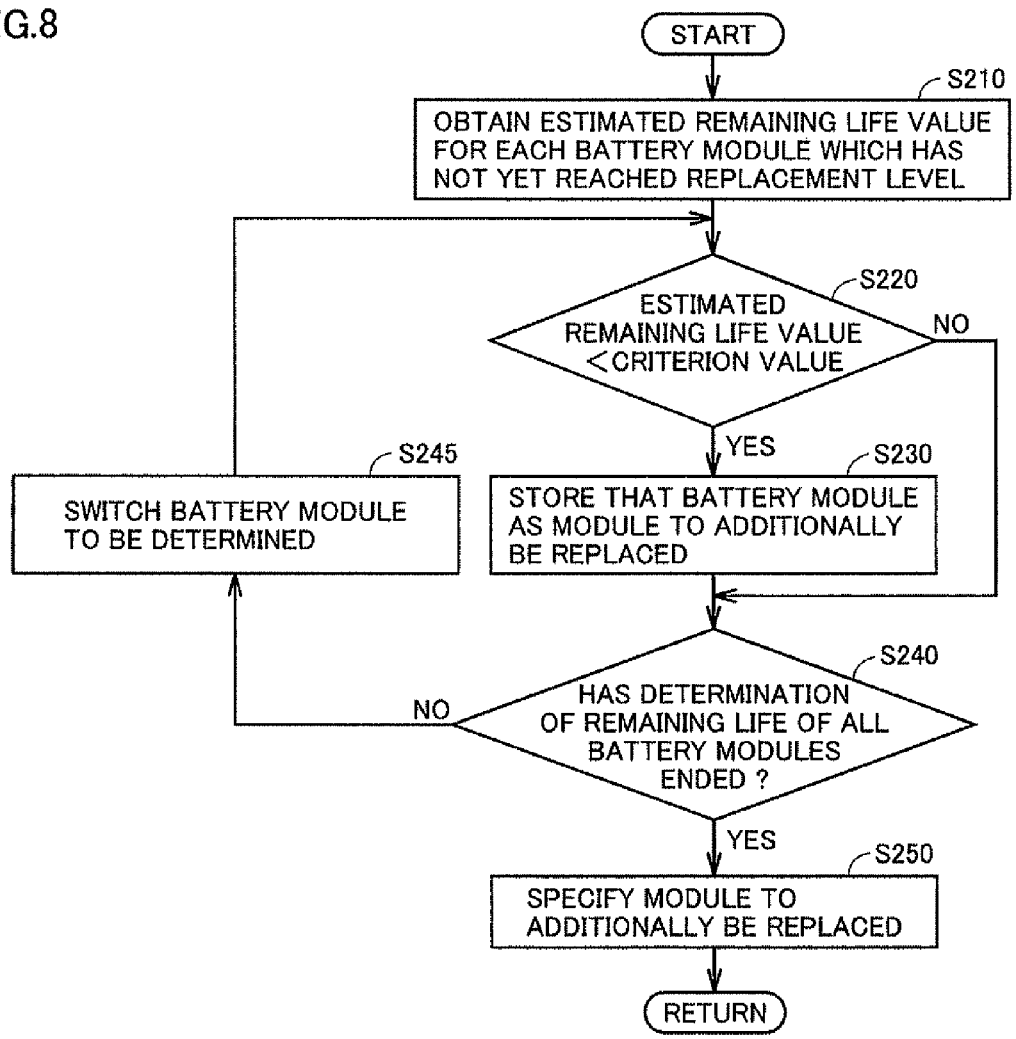
FIG. 8 is a flowchart illustrating a processing procedure for extracting a module to additionally be replaced in accordance with remaining life estimation.

FIG. 8 shows in detail a processing procedure in step S200 in extracting a module to additionally be replaced based on estimation of a remaining life.

Referring to FIG. 8, ECU 100 obtains in a step S210 an estimated remaining life value RL for battery module 15 which has not yet reached the replacement level. The estimated remaining life value can be obtained, for example, with a technique described in PTL 3. The processing in step S210 corresponds to the function of remaining life estimation unit 130 in FIG. 2.

Figure 9:
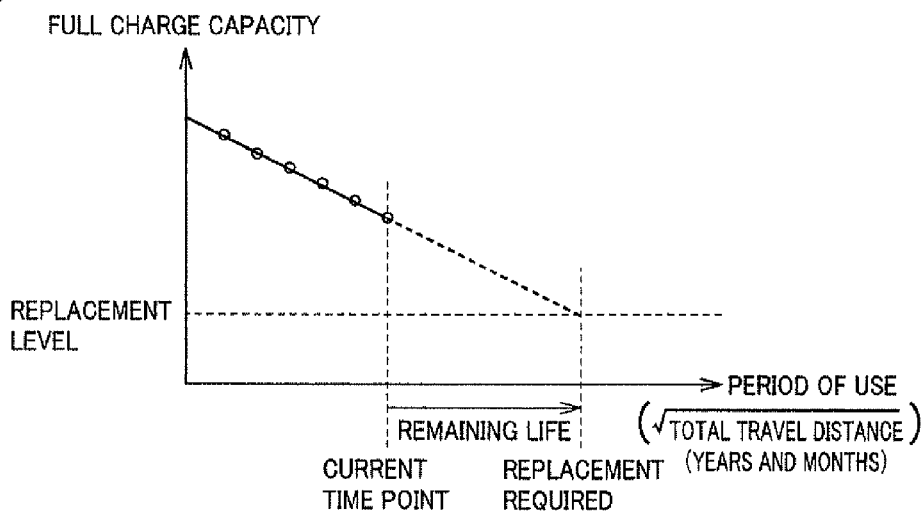
FIG. 9 is a first conceptual diagram illustrating remaining life estimation when the full charge capacity is set as a deterioration indicator.
Figure 10:
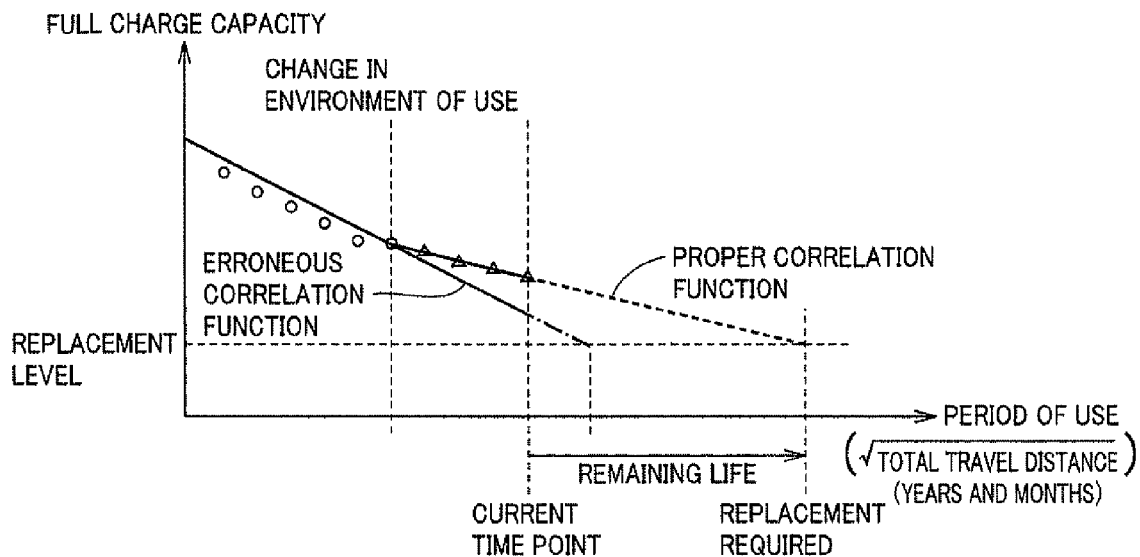
FIG. 10 is a second conceptual diagram illustrating remaining life estimation when the full charge capacity is set as a deterioration indicator.

FIGS. 9 and 10 are conceptual diagrams illustrating remaining life estimation when the full charge capacity is set as the deterioration indicator.

Referring to FIG. 9, ECU 100 determines a correlation function defined as a linear function having a trial period of the secondary battery (each battery module 15) as a variable so as to have a high correlation value with transition of the full charge capacity serving as the deterioration indicator, which has been obtained so far. The trial period can be represented by years and months. Alternatively, in a secondary battery (each battery module 15) mounted on an electrically powered vehicle, a square root of a travel distance of the vehicle can also be defined as a time period of use.

For example, ECU 100 determines such a correlation function that deviation from each of obtained full charge capacities is minimum by using the least squares method. Then, ECU 100 determines a point at which the determined correlation function intersects with the replacement level (CH1) as the life and obtains a trial period of the secondary battery corresponding to that life. Furthermore, a remaining period from the current time point until a period of use corresponding to the obtained life is calculated as the estimated remaining life value.

Referring to FIG. 10, as an environment of use of the secondary battery (each battery module 15) varies, a rate of deterioration thereof may vary, because a rate of deterioration of the secondary battery varies in accordance with the environment of use such as a user, frequency of use, a temperature at which the battery is used, or the like. Therefore, if a correlation function is found without distinguishing between full charge capacities before and after change in environment of use, there is a concern that error in remaining life estimation may be great.

Therefore, as shown in FIG. 10, when the environment of use of the secondary battery (each battery module 15) varies, a reset command can also be issued manually or automatically. Then, ECU 100 finds a proper correlation function and estimates a remaining life based on the stored full charge capacities at the time point of reception of the reset command and later. Thus, error in remaining life estimation in the case where the environment of use varies is reduced.

Figure 11:
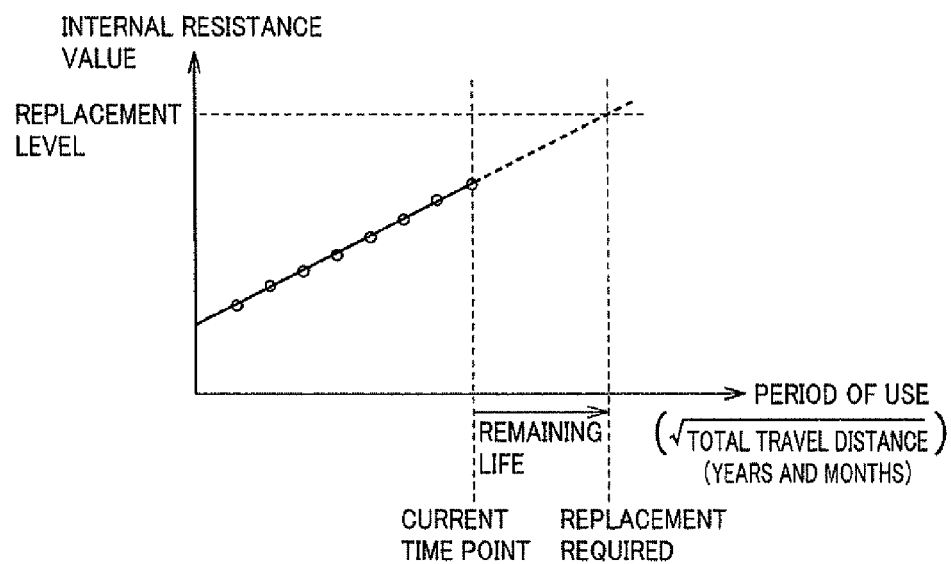
FIG. 11 is a first conceptual diagram illustrating remaining life estimation when the internal resistance is set as a deterioration indicator.
Figure 12:
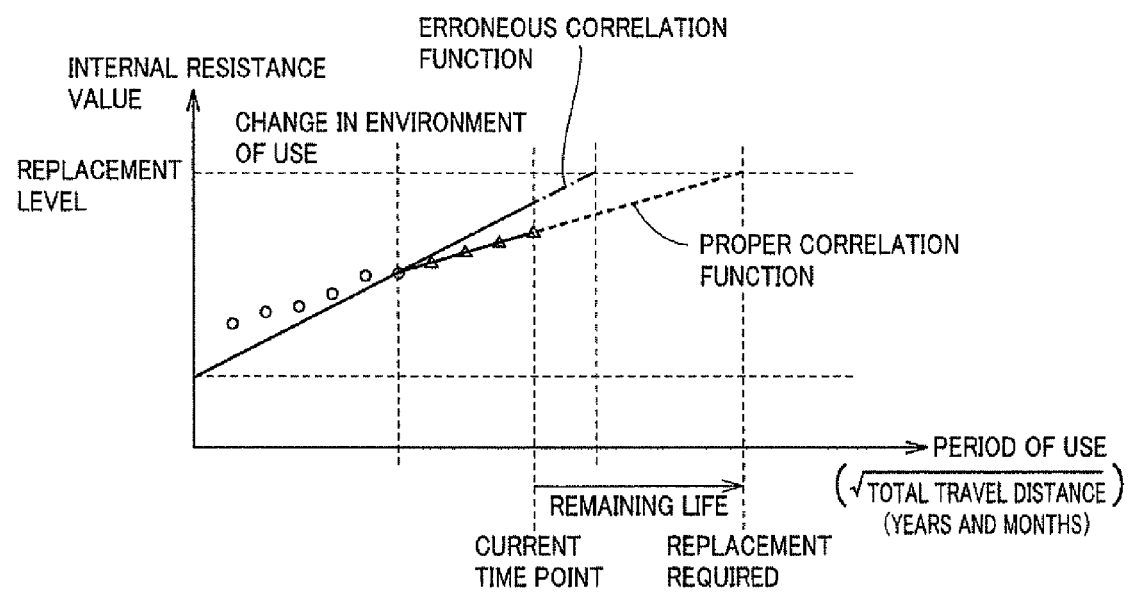
FIG. 12 is a second conceptual diagram illustrating remaining life estimation when the internal resistance is set as a deterioration indicator.

FIGS. 11 and 12 are conceptual diagrams illustrating remaining life estimation when the internal resistance is set as the deterioration indicator.

In FIGS. 11 and 12, an internal resistance is employed as the deterioration indicator. Therefore, in contrast to the full charge capacity (FIGS. 9 and 10), as deterioration of a battery proceeds, a value of the deterioration indicator increases. Except for this point, remaining life estimation using the internal resistance is similar to remaining life estimation using the full charge capacity. Namely, as shown in FIG. 11, ECU 100 determines a positive correlation function from the internal resistances serving as the deterioration indicator, which have been obtained so far. In addition, ECU 100 determines a point where the determined correlation function intersects with the replacement level (CH1) as the life and obtains a trial period of the secondary battery corresponding to that life. Furthermore, a remaining period from the current time point until a period of use corresponding to the obtained life is calculated as the estimated remaining life value.

Further as shown in FIG. 12, when an environment of use of the secondary battery (each battery module 15) varies, a reset command can also be issued manually or automatically. ECU 100 finds a proper correlation function and estimates a remaining life based on the stored internal resistances at the time point of reception of the reset command and later. Thus, error in remaining life estimation in the case where the environment of use varies is reduced.

Referring again to FIG. 8, ECU 100 compares in a step S220 estimated remaining life value RL obtained in step S210 for one battery module 15 with a prescribed criterion value. This criterion value represents a period of use (for example, a square root of a travel distance or years and months).

Then, when estimated remaining life value RL is smaller than the criterion value (determination as YES is made in S220), ECU 100 stores in a step S230 that battery module 15 as the module to additionally be replaced. On the other hand, when estimated remaining life value RL is greater than the criterion value (determination as NO is made in S220), step S230 is skipped. Therefore, that battery module 15 is not stored as the module to additionally be replaced.

ECU 100 determines in a step S240 whether or not remaining life determination has ended for all battery modules 15. When remaining life determination of all battery modules 15 has not ended (determination as NO is made in S240), ECU 100 switches in a step S245 a battery module to be determined and performs processing in steps S220, S230.

The processing in steps S220 to S245 is repeated until remaining life determination of all battery modules 15 ends. Thus, whether or not to extract each of the battery modules which have not yet reached the replacement level among the plurality of battery modules 15 as a module to additionally be replaced is determined based on the estimated remaining life value.

When remaining life determination of all battery modules 15 has ended (determination as YES is made in S240), ECU 100 specifies in a step S250 a module to additionally be replaced in accordance with battery module 15 stored in step S230.

Referring again to FIG. 7, when step S200 ends, ECU 100 evaluates in a step S300 cost for battery replacement. For example, cost for replacement of only some modules is compared with replacement of the entire secondary battery 10 based on the total number of modules to be replaced (S160) and modules to additionally be replaced (S200). For example, when the number of battery modules to be replaced is greater than a prescribed value predetermined in consideration of replacement cost, battery replacement of the entire secondary battery 10 is determined as preferable.

In addition, ECU 100 generates in a step S400 guidance information for battery replacement. As described above, the guidance information includes information for specifying a module to be replaced and a module to additionally be replaced. Moreover, a result of evaluation of battery replacement cost as described above may be included in the guidance information.

Thus, according to secondary battery deterioration determination in the present embodiment, based on a result of deterioration diagnosis for each battery module, a module to be replaced which has reached a level requiring replacement can be detected and a module to additionally be replaced of which simultaneous replacement is desired can be extracted also from battery modules which have not yet reached the replacement level. Consequently, battery replacement directed to a secondary battery for which replacement for each battery module is permitted can efficiently be carried out.

In addition, whether or not replacement is required is directly determined based on the deterioration indicator, whereas a module to additionally be replaced can be extracted based on estimation of a remaining life until the deterioration indicator reaches the replacement level, for battery modules of which deterioration indicator has not yet reached the replacement level. Thus, a module to additionally be replaced can be extracted with high accuracy.

Second Embodiment

Use of a lithium ion secondary battery has expanded for such advantages as high output voltage and output density. On the other hand, in the lithium ion secondary battery, it has been known that deposition of metal lithium greatly affects deterioration of the battery. Therefore, when deterioration of the lithium ion secondary battery is to be determined, a deterioration indicator based on quantitatively evaluated deposition of lithium is preferably employed.

In a second embodiment, a technique for quantitatively estimating an amount of deposition of lithium in the lithium ion secondary battery and determination of deterioration of the secondary battery based on the estimated amount of deposition of lithium will be described. Namely, in the second embodiment, each cell constituting secondary battery 10 (battery module 15) is a lithium ion secondary battery.

(As to Extraction of Amount of Deposition of Lithium)

In the second embodiment, in diagnosis of deterioration for each battery module 15, a positive electrode capacity retention ratio k1, a negative electrode capacity retention ratio k2, and a battery capacity fluctuation amount (deviated capacity) ΔQs are calculated. Positive electrode capacity retention ratio k1 is defined as a ratio of a positive electrode capacity in a deteriorated state to a positive electrode capacity in an initial state. Negative electrode capacity retention ratio k2 is defined as a ratio of a negative electrode capacity in a deteriorated state to a negative electrode capacity in an initial state. The deviated capacity refers to a deviated capacity of correspondence of composition between a positive electrode and a negative electrode and it corresponds to the "battery capacity fluctuation amount." These deterioration parameters will be described hereinafter in detail.

As is well known, a lithium ion secondary battery includes a negative electrode, a separator containing an electrolytic solution, and a positive electrode (none of which is shown). Each of the negative electrode and the positive electrode is constituted of an assembly of spherical active materials. During discharge of the lithium ion secondary battery, on an interface of the active material at the negative electrode, chemical reaction in which lithium ions Li+ and electrons e− are emitted takes place. On the other hand, on an interface of the active material at the positive electrode, chemical reaction in which lithium ions Li+ and electrons e− are absorbed takes place. During charge of the lithium ion secondary battery, reaction reverse to the reaction described above takes place.

In the negative electrode, a current collector plate absorbing electrons is provided, and in the positive electrode, a current collector plate emitting electrons is provided. The current collector plate in the negative electrode is formed, for example, of copper, and connected to a negative electrode terminal. The current collector plate of the positive electrode is formed, for example, of aluminum, and connected to a positive electrode terminal. As lithium ions are supplied and received between the positive electrode and the negative electrode with the separator being interposed, charging and discharging of the lithium ion secondary battery is carried out.

Here, a charged state in the lithium ion secondary battery is different depending on lithium concentration distribution in active materials in the respective positive electrode and negative electrode. This lithium contributes to reaction in the lithium ion secondary battery.

An output voltage V of the lithium ion secondary battery is expressed in Equation (1) below.

$$V = OCV(\theta_1, \theta_2) - R \times I \quad (1)$$

Here, OCV represents an open-circuit voltage of the lithium ion secondary battery, R represents a resistance in the entire lithium ion secondary battery, and I represents a battery current which flows in the lithium ion secondary battery. Resistance R includes a purely electrical resistance against transfer of electrons in the negative electrode and the positive electrode and a charge transfer resistance equivalently applied as an electrical resistance at the time when a reaction current is generated at the interface of the active material.

$\theta_1$ represents a local SOC (State of Charge) at the surface of the active material at the positive electrode and $\theta_2$ represents local SOC at the surface of the active material at the negative electrode. Resistance R has such characteristics as varying in accordance with change in $\theta_1$, $\theta_2$, and battery temperature. In other words, resistance R can be expressed as a function of $\theta_1$, $\theta_2$, and a battery temperature.

Local SOC $\theta_1$, $\theta_2$ is expressed in Equation (2) below.

$$\theta_i = C_{se,i}/C_{s,i,\max} (i=1,2) \quad (2)$$

Here, Cse, i represents lithium concentration (an average value) at the interface of the active material (the positive electrode or the negative electrode), and Cs, i, max represents limit lithium concentration at the active material (the positive electrode or the negative electrode). The limit lithium concentration refers to an upper limit value of lithium concentration in the positive electrode or the negative electrode.

Figure 13:
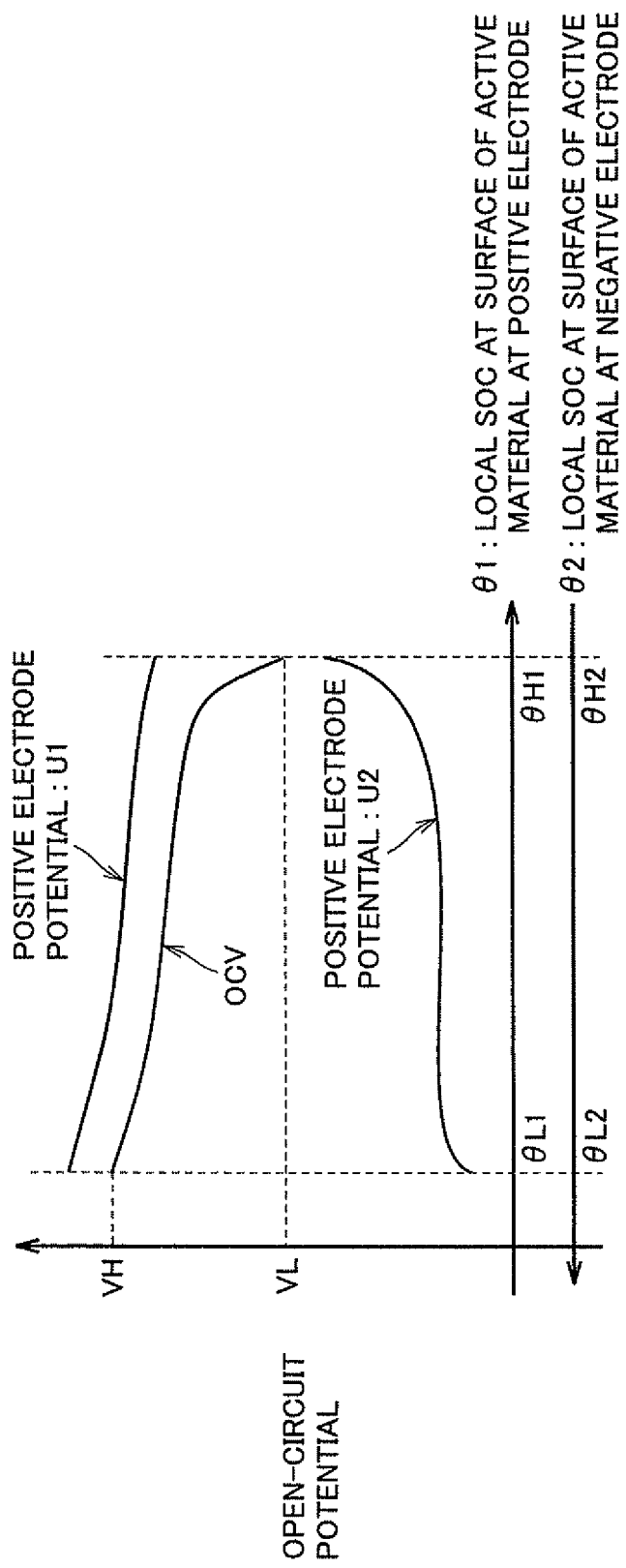
FIG. 13 is a conceptual diagram showing characteristics of change in open-circuit voltage with change in local SOC of a lithium ion secondary battery.

FIG. 13 is a conceptual diagram showing characteristics of change in open-circuit voltage with change in local SOC.

Referring to FIG. 13, open-circuit voltage OCV of the lithium ion secondary battery is expressed as a potential difference between a positive electrode open-circuit potential U1 and a negative electrode open-circuit potential U2. Positive electrode open-circuit potential U1 has characteristics varying in accordance with local SOC $\theta_1$ at the surface of the active material at the positive electrode, and negative electrode open-circuit potential U2 has characteristics varying in accordance with local SOC $\theta_2$ at the surface of the active material at the negative electrode.

By determining relation between local SOC $\theta_1$ and positive electrode open-circuit potential U1 while the lithium ion secondary battery is in an initial state, characteristics showing relation between local SOC $\theta_1$ and positive electrode open-circuit potential U1 (a curve of U1 shown in FIG. 13) can be obtained. The initial state refers to such a state that deterioration of the lithium ion secondary battery has not occurred, and for example, refers to a state immediately after manufacturing of the lithium ion secondary battery.

By determining relation between local SOC $\theta_2$ and negative electrode open-circuit potential U2 while the lithium ion secondary battery is in the initial state, characteristics showing relation between local SOC $\theta_2$ and negative electrode open-circuit potential U2 (a curve of U2 shown in FIG. 13) can be obtained. Data showing these characteristics (U1, U2) can be stored in advance in a memory as a map.

Open-circuit voltage OCV of the lithium ion secondary battery has such characteristics as lowering as discharge proceeds. In addition, in the lithium ion secondary battery after deterioration, an amount of lowering in voltage with respect to the same time period of discharging is greater than in the lithium ion secondary battery in the initial state. This fact shows that lowering in full charge capacity and change in open-circuit voltage characteristics have occurred due to deterioration of the lithium ion secondary battery.

In the present embodiment, change in open-circuit voltage characteristics with deterioration of the lithium ion secondary battery is modeled as two phenomena considered to occur in the lithium ion secondary battery in the deteriorated state. These two phenomena are decrease in single-electrode capacity in the positive electrode and the negative electrode and deviation of correspondence of composition between the positive electrode and the negative electrode.

Decrease in single-electrode capacity refers to lowering in ability to accept lithium in each of the positive electrode and the negative electrode. Lowering in ability to accept lithium means that active materials and the like effectively functioning during charging and discharging have decreased.

Figure 14:
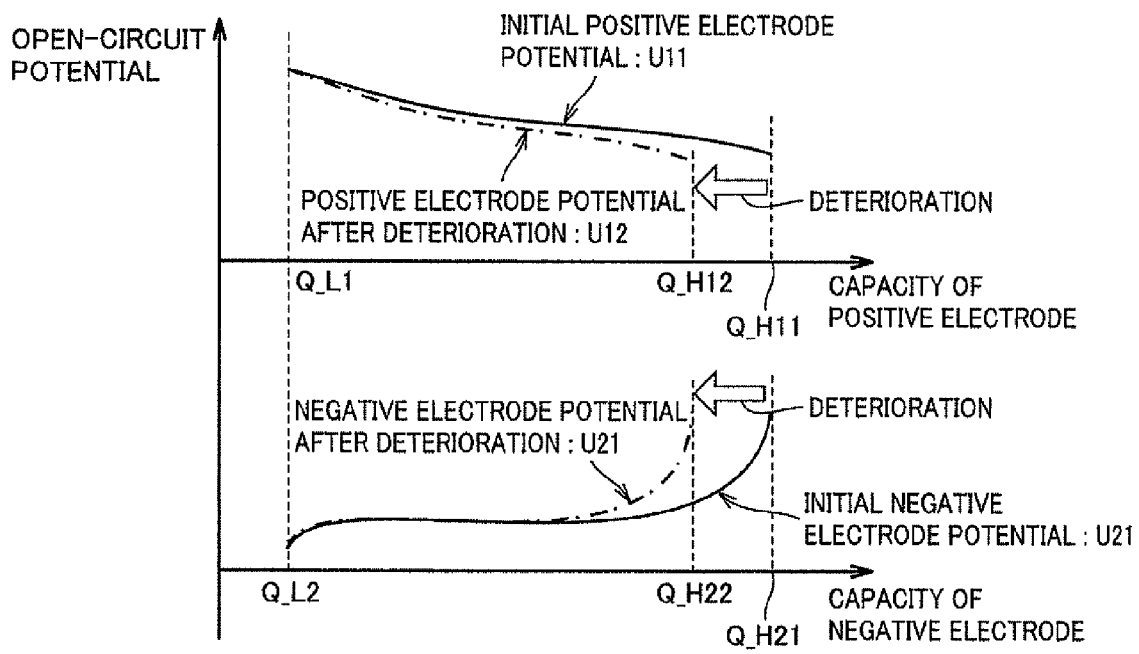
FIG. 14 is a graph schematically showing change in single-electrode open-circuit potential due to decrease in single-electrode capacity in the lithium ion secondary battery.

FIG. 14 is a graph schematically showing change in single-electrode open-circuit potential due to decrease in single-electrode capacity.

In FIG. 14, Q_L1 on an axis of a positive electrode capacity is a capacity corresponding to local SOC=θL1 in FIG. 13 in the initial state of the lithium ion secondary battery. Q_H11 is a capacity corresponding to local SOC=θH1 in FIG. 13 in the initial state of the lithium ion secondary battery. In addition, Q_L2 on an axis of a negative electrode capacity is a capacity corresponding to local SOC θL2 in FIG. 13 in the initial state of the lithium ion secondary battery and Q_H21 is a capacity corresponding to local SOC=θH2 in FIG. 13 in the initial state of the lithium ion secondary battery.

When ability to accept lithium lowers in the positive electrode, a capacity corresponding to local SOC θ1 of the positive electrode changes from Q_H11 to Q_H12. Meanwhile, when ability to accept lithium lowers in the negative electrode, a capacity corresponding to local SOC θ2 of the negative electrode changes from Q_H21 to Q_H22.

Here, even when the lithium ion secondary battery deteriorates, relation between local SOC θ1 and positive electrode open-circuit potential U1 (FIG. 13) does not change. Therefore, when relation between local SOC θ1 and positive electrode open-circuit potential U1 is converted to relation between the positive electrode capacity and the positive electrode open-circuit potential, as shown in FIG. 14, a curve showing relation between the positive electrode capacity and the positive electrode open-circuit potential is in a state shrunk with respect to the curve in the initial state, by an amount comparable to deterioration of the lithium ion secondary battery.

Meanwhile, when relation between local SOC θ2 and negative electrode open-circuit potential U2 is converted to relation between the negative electrode capacity and the negative electrode open-circuit potential, as shown in FIG. 14, a curve showing relation between the negative electrode capacity and the negative electrode open-circuit potential is in a state shrunk with respect to the curve in the initial state, by an amount comparable to deterioration of the lithium ion secondary battery.

Figure 15:
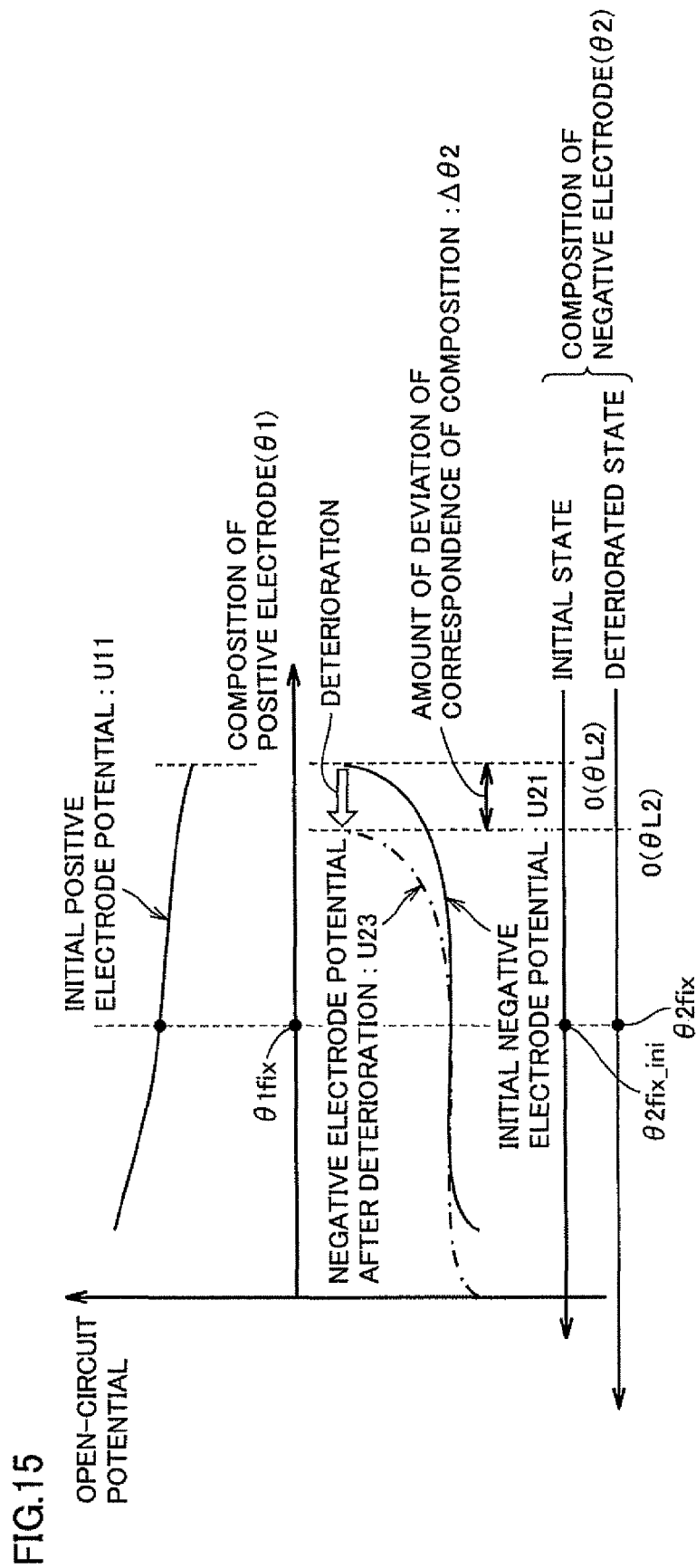
FIG. 15 is a conceptual diagram schematically showing relation between an open-circuit potential and deviation of correspondence of composition between a positive electrode and a negative electrode in the lithium ion secondary battery.

FIG. 15 is a conceptual diagram schematically showing relation between an open-circuit potential and deviation of correspondence of composition between the positive electrode and the negative electrode. Deviation of correspondence of composition shows that combination of composition (θ1) of the positive electrode and composition (θ2) of the negative electrode deviates from that in the initial state of the lithium ion secondary battery when charging and discharging is carried out using a set of the positive electrode and the negative electrode.

A curve showing relation between composition θ1, θ2 of a single electrode and open-circuit potential U1, U2 is similar to the curve shown in FIG. 13. Here, as the lithium ion secondary battery deteriorates, an axis of negative electrode composition θ2 shifts by Δθ2 in a direction of decrease in positive electrode composition θ1. Thus, the curve showing relation between negative electrode composition θ2 and negative electrode open-circuit potential U2 shifts by Δθ2 in the direction of decrease in positive electrode composition θ1, with respect to the curve in the initial state.

Composition of the negative electrode corresponding to composition θ1fix of the positive electrode is "θ2fix_ini" while the lithium ion secondary battery is in the initial state, however, after the lithium ion secondary battery has deteriorated, the composition becomes "θ2fix". It is noted that negative electrode composition θL2 shown in FIG. 13 is 0 in FIG. 15, which shows that the negative electrode has become completely rid of lithium.

In the present embodiment, by introducing three deterioration parameters of positive electrode capacity retention ratio k1, negative electrode capacity retention ratio k2, and a deviation amount of correspondence of composition ΔQs between the positive and negative electrodes, two deterioration phenomena described above are modeled.

As described above, positive electrode capacity retention ratio k1 is defined as a ratio of a positive electrode capacity in the deteriorated state to a positive electrode capacity in the initial state. Here, the positive electrode capacity is assumed to have decreased by an arbitrary amount from the capacity in the initial state after the lithium ion secondary battery entered the deteriorated state. Here, positive electrode capacity retention ratio k1 is expressed in Equation (3) below.

$$k1=(Q1\_ini-\Delta Q1)/Q1\_ini \quad (3)$$

$(0<k1<1)$

Here, Q1_ini represents the positive electrode capacity (Q_H11 shown in FIG. 14) when the lithium ion secondary battery is in the initial state, and ΔQ1 represents an amount of decrease in positive electrode capacity when the lithium ion secondary battery has deteriorated. Positive electrode capacity Q1_ini can be found in advance through experiments.

As described above, negative electrode capacity retention ratio k2 is defined as a ratio of a negative electrode capacity in the deteriorated state to a negative electrode capacity in the initial state. Here, the negative electrode capacity is assumed to have decreased by an arbitrary amount from the capacity in the initial state after the lithium ion secondary battery entered the deteriorated state. Here, negative electrode capacity retention ratio k2 is expressed in Equation (4) below.

$$k2=(Q2\_ini-\Delta Q2)/Q2\_ini \quad (4)$$

$(0<k2<1)$

Here, Q2_ini represents the negative electrode capacity (Q_H21 shown in FIG. 14) when the lithium ion secondary battery is in the initial state, and ΔQ2 represents an amount of decrease in negative electrode capacity when the lithium ion secondary battery has deteriorated. Negative electrode capacity Q2_ini can be found in advance through experiments.

Figure 16:
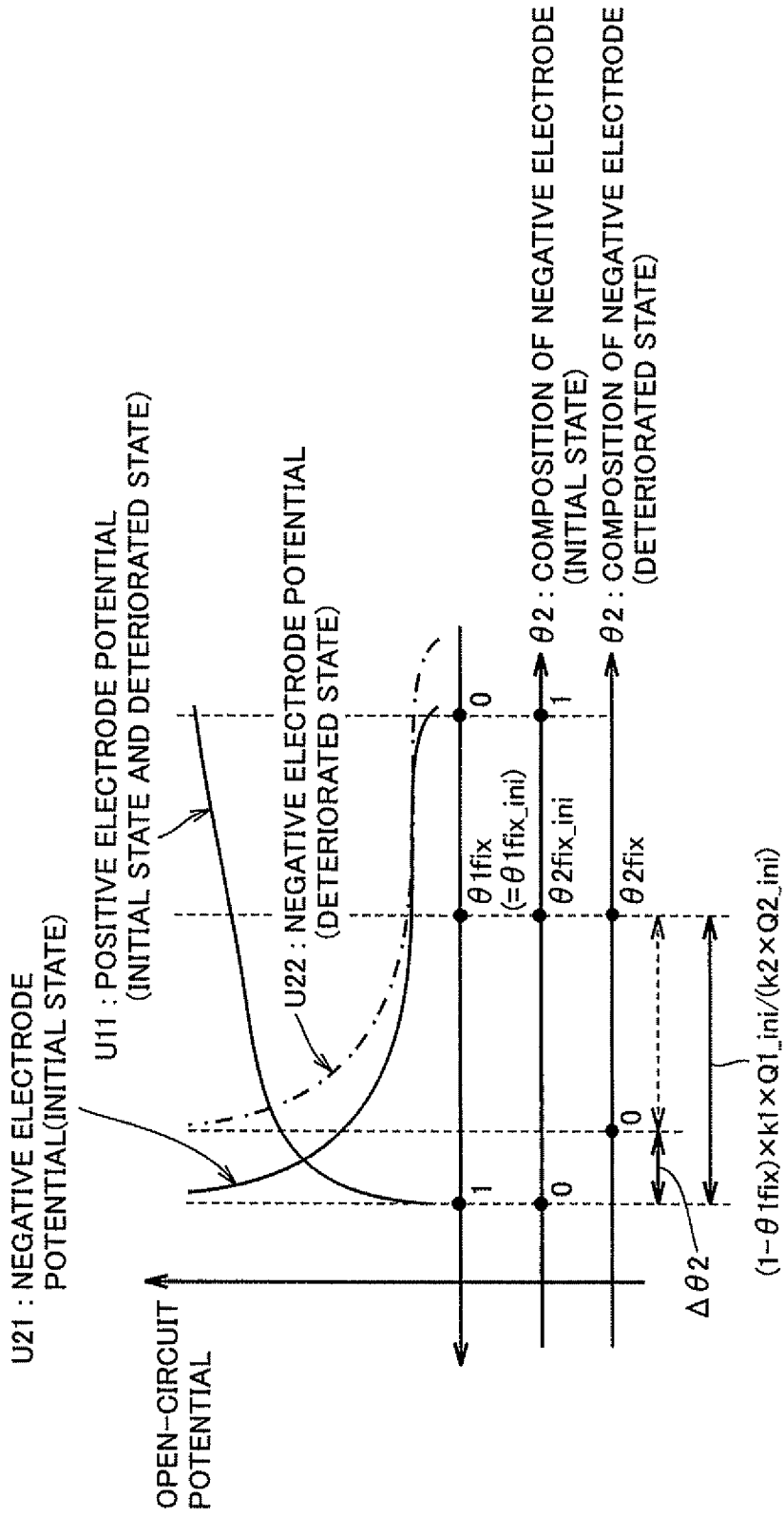
FIG. 16 is a schematic diagram illustrating deviation of correspondence of composition due to deterioration of the lithium ion secondary battery.

FIG. 16 is a schematic diagram illustrating deviation of correspondence of composition due to deterioration.

When the lithium ion secondary battery is in the deteriorated state, a capacity at the time when negative electrode composition θ2 is 1 is (Q2_ini−ΔQ2). In addition, deviated capacity of correspondence of composition ΔQ2 between the positive electrode and the negative electrode is a capacity corresponding to a deviation amount Δθ2 on the axis of the composition of the negative electrode from the axis of the composition of the positive electrode. Thus, relation in Equation (5) below holds.

$$1:\Delta\theta 2=(Q2\_ini-\Delta Q2):\Delta Qs \quad (5)$$

Equation (6) below is found from Equation (4) and Equation (5).

$$\Delta Qs = (Q2\_ini - \Delta Q2) \times \Delta\theta 2 \quad (6)$$
$$= k2 \times Q2\_ini \times \Delta\theta 2$$

When the lithium ion secondary battery is in the initial state, positive electrode composition $\theta 1fix\_ini$ corresponds to negative electrode composition $\theta 2fix\_ini$. When the lithium ion secondary battery is in the deteriorated state, positive electrode composition $\theta 1fix$ corresponds to negative electrode composition $\theta 2fix$. In addition, deviation of correspondence of composition is based on positive electrode composition $\theta 1fix$ in the initial state. Namely, positive electrode composition $\theta 1fix$ and positive electrode composition $\theta 1fix\_ini$ are equal to each other in value.

In the case where deterioration of the lithium ion secondary battery has caused deviation of correspondence of composition between the positive electrode and the negative electrode, positive electrode composition $\theta 1fix$ and negative electrode composition $\theta 2fix$ after deterioration of the lithium ion secondary battery satisfy relation in Equations (7), (8) below.

$$\theta 1fix=\theta 1fix\_ini \quad (7)$$

$$\theta 2fix=[(1-\theta 1fix)\times k1\times Q1\_ini-\Delta Q2]/(k2\times Q2\_ini) \quad (8)$$

What is meant by Equation (8) will be described. When positive electrode composition $\theta 1$ varies (decreases) from 1 to $\theta 1fix$ due to deterioration of the lithium ion secondary battery, an amount of lithium emitted from the positive electrode is expressed in Equation (9) below.

$$\text{Amount of Lithium Emitted From Positive Electrode}=(1-\theta 1fix)\times k1\times Q1\_ini \quad (9)$$

Here, a value of $(1-\theta 1fix)$ represents an amount of change in positive electrode composition due to deterioration of the lithium ion secondary battery, and a value of $(k1\times Q1\_ini)$ represents a positive electrode capacity after deterioration of the lithium ion secondary battery.

When it is assumed that lithium emitted from the positive electrode is completely taken into the negative electrode, negative electrode composition $\theta 2fix$ is expressed in Equation (10) below.

$$\theta 2fix=(1-\theta 1fix)\times k1\times Q1\_ini/(k2\times Q2\_ini) \quad (10)$$

Here, a value of $(k2\times Q2\_ini)$ represents a negative electrode capacity after deterioration of the lithium ion secondary battery.

On the other hand, when deviation of correspondence of composition between the positive electrode and the negative electrode ($\Delta\theta 2$) is present, negative electrode composition $\theta 2fix$ is expressed in Equation (11) below.

$$\theta 2fix=(1-\theta 1fix)\times k1\times Q1\_ini/(k2\times Q2\_ini)-\Delta\theta 2 \quad (11)$$

Deviation amount of correspondence of composition $\Delta\theta 2$ can be expressed by using deviated capacity of correspondence of composition $\Delta Qs$ in Equation (6). Thus, negative electrode composition $\theta 2fix$ is expressed in Equation (8) above.

As shown in FIG. 16, open-circuit voltage OCV while the lithium ion secondary battery is in the deteriorated state is expressed as a potential difference between a positive electrode open-circuit potential U11 and a negative electrode open-circuit potential U22 in the deteriorated state. Namely, by estimating three deterioration parameters k1, k2, $\Delta Qs$, negative electrode open-circuit potential U22 while the lithium ion secondary battery is in the deteriorated state can be specified, and open-circuit voltage OCV can be calculated as the potential difference between negative electrode open-circuit potential U22 and positive electrode open-circuit potential U11.

In the present embodiment, by further using deterioration parameters k1, k2, $\Delta Qs$, whether or not an internal state of the lithium ion secondary battery, specifically, deterioration of the lithium ion secondary battery, has been caused by deposition of lithium is estimated. In general, since deterioration of the lithium ion secondary battery includes deterioration due to deposition of lithium and age-related deterioration, the deteriorated state can be determined in detail by grasping (estimating) such deterioration as being distinguished from each other.

Age-related deterioration means lowering in performance (ability to accept lithium) of the positive electrode and the negative electrode due to current passage or having been left, and for example, wear of active materials at the positive electrode or the negative electrode is exemplified. In addition, deterioration of composition between the positive electrode and the negative electrode caused by formation of a coating film or the like on a surface of an active material is also exemplified as one example of age-related deterioration.

Meanwhile, deterioration due to deposition of lithium refers to such deterioration that lithium ions used for battery reaction changes to metal lithium, which no longer contributes to battery reaction.

Open-circuit voltage OCV at the time when the lithium ion secondary battery has not deteriorated will match with open-circuit voltage OCV in the lithium ion secondary battery in the initial state. Namely, when positive electrode capacity retention ratio k1 and negative electrode capacity retention ratio k2 are both 1 and deviated capacity of correspondence of composition $\Delta Qs$ is 0, open-circuit voltage OCV calculated (estimated) in accordance with the description above will match with a value at the time when open-circuit voltage OCV of the lithium ion secondary battery in the initial (new) state is measured (actually measured value).

Figure 17:
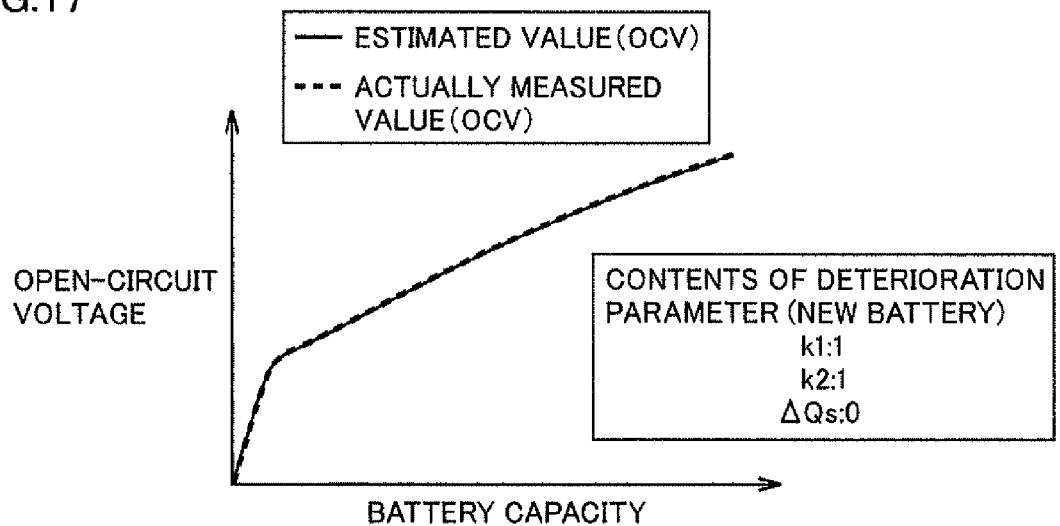
FIG. 17 is a diagram illustrating a deterioration parameter when an open-circuit voltage curve (estimated value) is matched with an open-circuit voltage curve (actually measured value) in the case where a new lithium ion secondary battery is used.

FIG. 17 shows relation between a capacity (SOC) and open-circuit voltage OCV of the lithium ion secondary battery (that is, open-circuit voltage characteristics). In the following, a curve shown in FIG. 17 and the like, which represents open-circuit voltage characteristics, will also be referred to as an "open-circuit voltage curve." A dotted line in FIG. 17 shows an open-circuit voltage curve (actually measured value) and a solid line shows an open-circuit voltage curve (estimated value). The open-circuit voltage curve (estimated value) lies over the open-circuit voltage curve (actually measured value).

In FIG. 17, the ordinate represents open-circuit voltage OCV and the abscissa represents a capacity of the lithium ion secondary battery.

On the other hand, when the lithium ion secondary battery deteriorates, open-circuit voltage (actually measured value) OCV changes. Here, a dotted line in FIG. 18 (a figure corresponding to FIG. 17) shows a result of measurement of an open-circuit voltage curve (actually measured value) by using a lithium ion secondary battery where only deterioration due to deposition of lithium has occurred, in other words, a lithium ion secondary battery where age-related deterioration has not occurred.

Here, by maintaining the lithium ion secondary battery in a low temperature state, age-related deterioration can be suppressed and only deposition of lithium can be caused while age-related deterioration is suppressed. By conducting an experiment as to whether or not age-related deterioration occurs under a plurality of temperature conditions, a setting temperature at the time when the lithium ion secondary battery is set to a low temperature state can be determined. Thus, only deterioration due to deposition of lithium can be caused in the lithium ion secondary battery.

Figure 18:
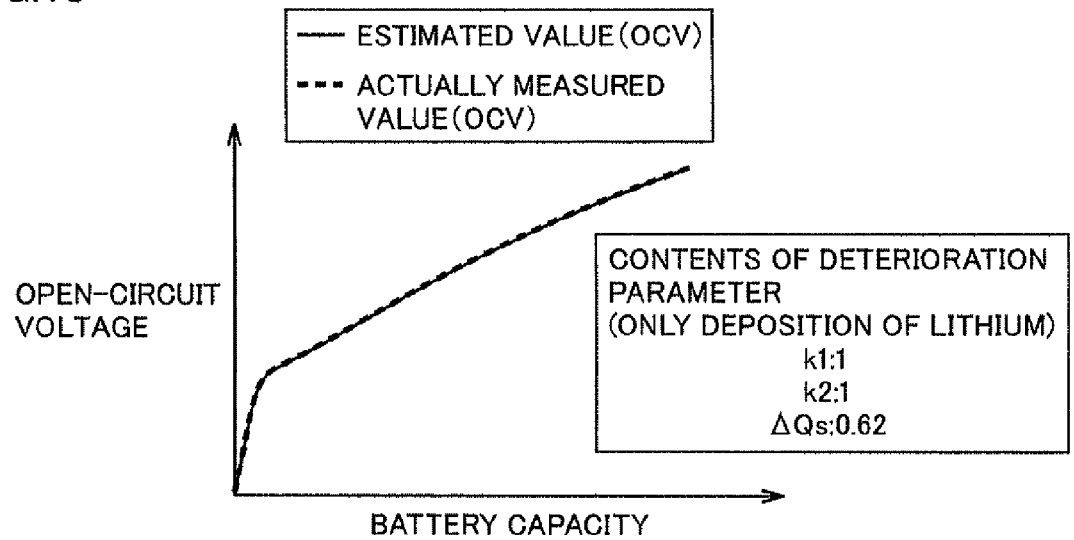
FIG. 18 is a diagram illustrating a deterioration parameter when an open-circuit voltage curve (estimated value) is matched with an open-circuit voltage curve (actually measured value) in the case where only deterioration due to deposition of lithium is caused.

By correctly estimating three deterioration parameters (k1, k2, ΔQs), the open-circuit voltage curve (estimated value) can substantially match with the open-circuit voltage curve (actually measured value) shown in FIG. 18. In other words, three deterioration parameters can be searched for such that the open-circuit voltage curve (estimated value) substantially matches with the open-circuit voltage curve (actually measured value).

FIG. 18 shows such a state that open-circuit voltage (actually measured value) OCV and open-circuit voltage (estimated value) OCV substantially match with each other. As deterioration parameters determining the open-circuit voltage curve (estimated value) here, positive electrode capacity retention ratio k1 is set to "1", negative electrode capacity retention ratio k2 is set to "1", and deviated capacity of correspondence of composition ΔQs is set to "0.62". By searching for three deterioration parameters (k1, k2, ΔQs) such that the open-circuit voltage curve (estimated value) substantially matches with the open-circuit voltage curve (actually measured value) shown in FIG. 18, deterioration parameter values above can be obtained.

Figure 19:
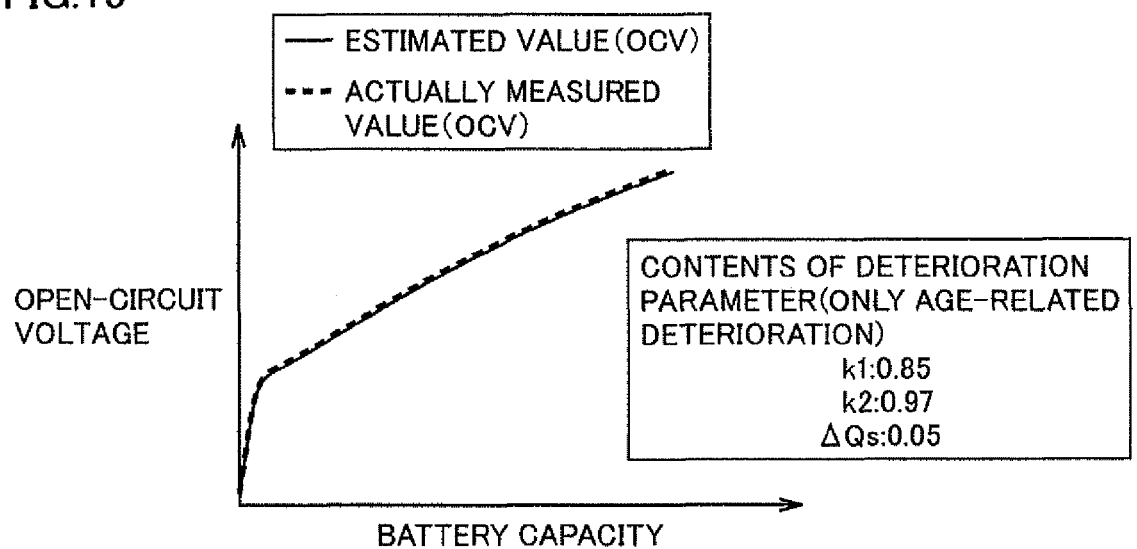
FIG. 19 is a diagram illustrating a deterioration parameter when an open-circuit voltage curve (estimated value) is matched with an open-circuit voltage curve (actually measured value) in the case where only age-related deterioration is caused.

A dotted line in FIG. 19 shows results of measurement of an open-circuit voltage curve (actually measured value) by using a lithium ion secondary battery where only age-related deterioration has occurred, in other words, a lithium ion secondary battery where lithium has not deposited. In FIG. 19, the ordinate represents open-circuit voltage OCV and the abscissa represents a capacity of the lithium ion secondary battery.

Here, by maintaining the lithium ion secondary battery in a high temperature state, deposition of lithium can be suppressed and only age-related deterioration can be caused while deposition of lithium is suppressed. By conducting an experiment as to whether or not lithium deposits under a plurality of temperature conditions, a setting temperature at the time when the lithium ion secondary battery is set to a high temperature state can be determined. For example, 50 degrees can be set as the setting temperature. Thus, only age-related deterioration can be caused in the lithium ion secondary battery.

FIG. 19 shows such a state that open-circuit voltage (actually measured value) OCV and open-circuit voltage (estimated value) OCV substantially match with each other. As deterioration parameters determining the open-circuit voltage curve (estimated value) here, positive electrode capacity retention ratio k1 is set to "0.85", negative electrode capacity retention ratio k2 is set to "0.97", and deviated capacity of correspondence of composition ΔQs is set to "0.05". By searching for three deterioration parameters (k1, k2, ΔQs) such that the open-circuit voltage curve (estimated value) substantially matches with the open-circuit voltage curve (actually measured value) shown in FIG. 19, deterioration parameter values above can be obtained.

As shown in FIGS. 18 and 19, it can be seen that, in the lithium ion secondary battery where only deterioration due to deposition of lithium has occurred, only deviated capacity of correspondence of composition ΔQs among three deterioration parameters (k1, k2, ΔQs) has changed as compared with deviated capacity of correspondence of composition ΔQs (=0) in a new lithium ion secondary battery (in the initial state).

In addition, it can be seen that, in the lithium ion secondary battery where only age-related deterioration has occurred, all of three deterioration parameters (k1, k2, ΔQs) deviate from those of a new lithium ion secondary battery (in the initial state). It is noted that deviated capacity of correspondence of composition ΔQs in the case of age-related deterioration is smaller than deviated capacity of correspondence of composition ΔQs in the case of deterioration due to deposition of lithium.

Deposition of lithium includes, for example, a case where lithium ions emitted from the positive electrode during charging are not taken into the negative electrode. In this case, deviation of correspondence of composition between the positive electrode and the negative electrode takes place and deviated capacity ΔQs varies. In addition, in a state that only deposition of lithium has occurred, since ability to accept lithium at the positive electrode and the negative electrode does not lower, each of positive electrode capacity retention ratio k1 and negative electrode capacity retention ratio k2 is maintained at "1".

Thus, since deviated capacity ΔQs includes deviated capacity ΔQs(Li) attributed to deterioration due to deposition of lithium and deviated capacity ΔQs(W) attributed to age-related deterioration, an amount of deposition of lithium can quantitatively be estimated by separation therebetween.

Initially, a map used for specifying a deterioration component due to aging will be described. This map shows correspondence between positive electrode capacity retention ratio k1, negative electrode capacity retention ratio k2 and deviated capacity of correspondence of composition ΔQs when only age-related deterioration is caused in the lithium ion secondary battery. This map can be created in advance based on results of experiments. As described above, by maintaining the lithium ion secondary battery in a high temperature state, deposition of lithium can be prevented and an experiment in which only age-related deterioration is caused can be conducted.

By causing age-related deterioration to proceed in a stepwise fashion, a capacity of the lithium ion secondary battery (full charge capacity) is decreased by a prescribed amount in a stepwise fashion. Then, each time the capacity of the lithium ion secondary battery is decreased, open-circuit voltage OCV of the lithium ion secondary battery is measured. Thus, when the lithium ion secondary battery has deteriorated by a prescribed capacity, data showing change in open-circuit voltage OCV with change in capacity (open-circuit voltage curve (actually measured value)) can be obtained. For example, a capacity is lowered (deteriorated) 5% by 5% until the capacity of the lithium ion secondary battery reaches 50% from 100%, and each time the capacity is lowered, open-circuit voltage OCV of the lithium ion secondary battery is measured.

Then, deterioration parameters (positive electrode capacity retention ratio k1, negative electrode capacity retention ratio k2, and deviated capacity ΔQs) for matching open-circuit voltage (estimated value) OCV with open-circuit voltage (actually measured value) OCV obtained at each capacity deterioration can be searched for.

Figure 20:
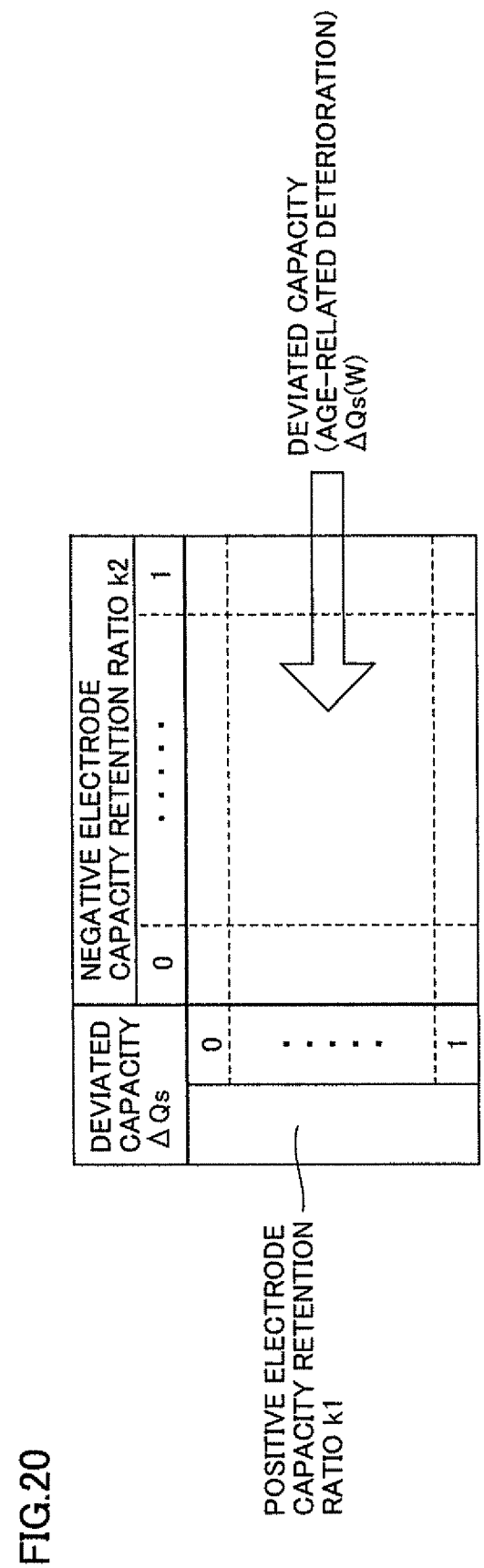
FIG. 20 is a diagram showing relation of a deviated capacity of correspondence of composition with a positive electrode capacity retention ratio and a negative electrode capacity retention ratio in the case where only age-related deterioration is caused.

A map shown in FIG. 20 (hereinafter referred to as an age-related deterioration map) can thus be obtained. The age-related deterioration map shown in FIG. 20 shows correspondence between positive electrode capacity retention ratio k1, negative electrode capacity retention ratio k2 and deviated capacity $\Delta Qs(W)$, and for example, by selecting positive electrode capacity retention ratio k1 and negative electrode capacity retention ratio k2, deviated capacity $\Delta Qs(W)$ attributed to age-related deterioration can be specified. The age-related deterioration map can be stored in a memory.

In the present embodiment, by obtaining data (open-circuit voltage curve) showing change in open-circuit voltage (actually measured value) OCV with change in capacity for each battery module 15 as shown in FIGS. 17 to 19, deterioration parameters (k1, k2, $\Delta Qs$) for matching open-circuit voltage (estimated value) OCV with open-circuit voltage (actually measured value) OCV can be searched for.

The open-circuit voltage curve can be found at least by charging off-board, secondary battery 10 (lithium ion secondary battery) of which use has ended or by causing secondary battery 10 to discharge off-board. It is noted that open-circuit voltage characteristics can also be determined on-board during use of secondary battery 10.

For example, ECU 100 can also determine an open-circuit voltage curve on-board during use of the lithium ion secondary battery (battery module 15). For example, change in open-circuit voltage can be determined based on a detection value of a battery voltage while the lithium ion secondary battery is relaxed (duration of such a state that battery current=0), and change in capacity can be determined based on an integrated value of battery currents Ib.

Alternatively, in the power supply system in FIG. 1, in correspondence with change in capacity during charging of secondary battery 10 with external power supply 80, the open-circuit voltage characteristics can be determined by determining change in battery voltage Vb.

(Deterioration Determination with Lithium Deposition Amount Serving as Deterioration Indicator)

Figure 21:
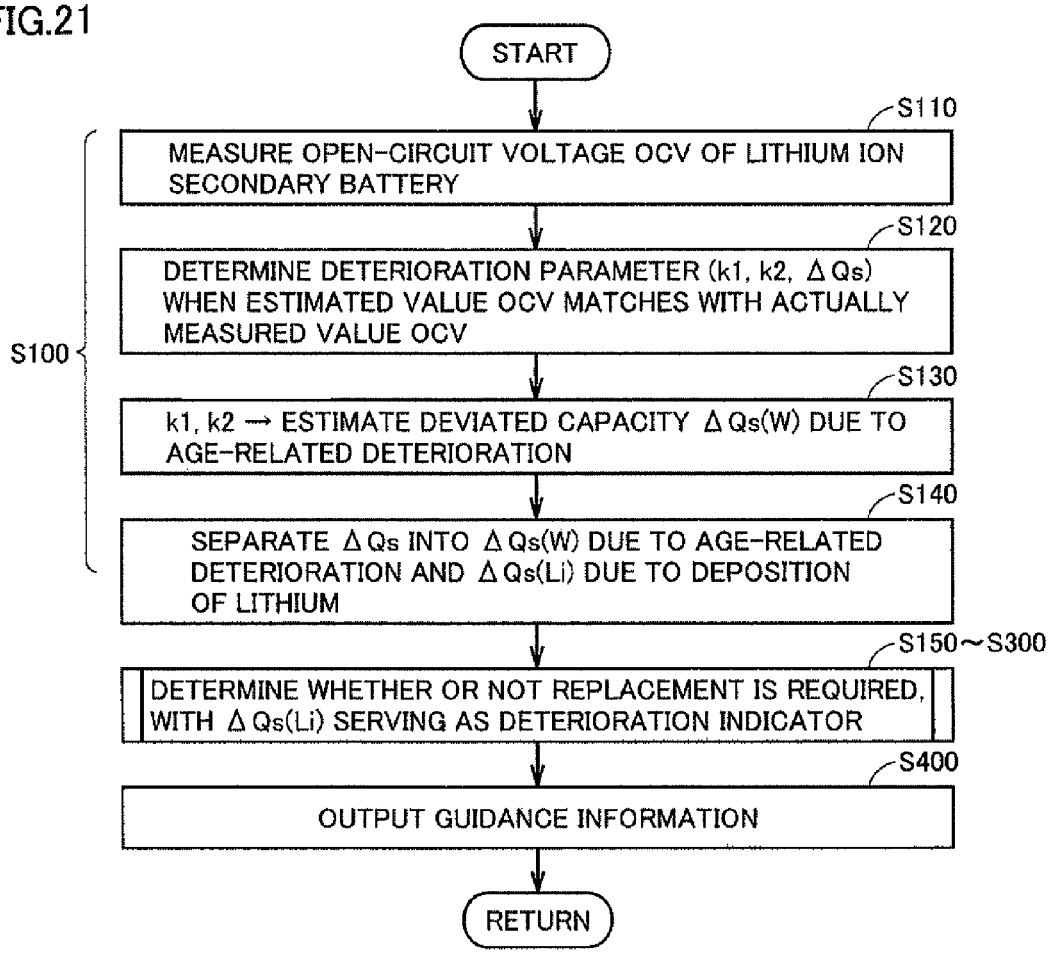
FIG. 21 is a flowchart showing a processing procedure for secondary battery deterioration determination according to a second embodiment of the present invention.

FIG. 21 is a flowchart showing a processing procedure for secondary battery deterioration determination according to the second embodiment of the present invention.

Referring to FIG. 21, ECU 100 obtains parameter $\Delta Qs(Li)$ quantitatively showing an amount of deposition of lithium as deterioration indicator DI, by performing S110 to S140 as step S100 shown in FIG. 7.

ECU 100 measures in a step S110, open-circuit voltage (actually measured value) OCV of the lithium ion secondary battery (battery module 15) of which deterioration is to be determined. As described above, by measuring open-circuit voltage (actually measured value) OCV in parallel to charging and discharging of lithium ion secondary battery (each battery module 15), the open-circuit voltage curve (actually measured value) can be obtained.

ECU 100 determines in a step S120, whether or not open-circuit voltage (estimated value) OCV specified by three deterioration parameters (positive electrode capacity retention ratio k1, negative electrode capacity retention ratio k2, and deviated capacity $\Delta Qs$) matches with open-circuit voltage (actually measured value) OCV obtained in step S110, while varying three deterioration parameters as appropriate.

Figure 22:
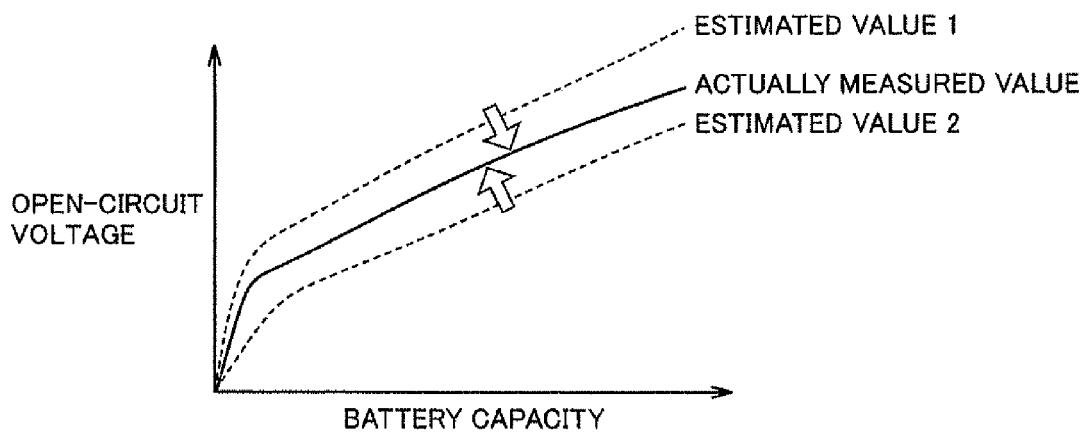
FIG. 22 is a conceptual diagram for illustrating processing for matching with an open-circuit voltage curve (estimated value) and an open-circuit voltage curve (actually measured value).

As shown in FIG. 22, specifically, arbitrary combination of three parameters is set and open-circuit voltage (estimated value) OCV is calculated based on the set deterioration parameters. FIG. 22 shows one example of relation between open-circuit voltage (estimated value) OCV shown with a dotted line and open-circuit voltage (actually measured value) OCV shown with a solid line.

When the open-circuit voltage curve having an estimated value 1 is obtained in FIG. 22, open-circuit voltage (estimated value) OCV is higher than open-circuit voltage (actually measured value) OCV, and therefore deterioration parameters are again set such that the open-circuit voltage curve of the estimated value is closer to the open-circuit voltage curve of the actually measured value. Similarly, when the open-circuit voltage curve having an estimated value 2 is obtained, open-circuit voltage (estimated value) OCV is lower than open-circuit voltage (actually measured value) OCV, and therefore deterioration parameters are again set such that the open-circuit voltage curve of the estimated value is closer to the open-circuit voltage curve of the actually measured value. By thus repeatedly making setting of the deterioration parameters, open-circuit voltage (estimated value) OCV can match with open-circuit voltage (actually measured value) OCV.

Referring again to FIG. 21, in step S120, deterioration parameters at the time when open-circuit voltage (estimated value) OCV has matched with open-circuit voltage (actually measured value) OCV are specified. Thus, positive electrode capacity retention ratio k1, negative electrode capacity retention ratio k2, and deviated capacity $\Delta Qs$ are determined. It is noted that deviated capacity $\Delta Qs$ determined in step S120 is a deviated capacity including both of a deviated capacity due to deterioration caused by deposition of lithium and a deviated capacity due to age-related deterioration.

Here, even though open-circuit voltage (estimated value) OCV does not exactly match with open-circuit voltage (actually measured value) OCV, by setting a range regarded as match (an allowable error), whether or not open-circuit voltage (estimated value) OCV and open-circuit voltage (actually measured value) OCV match with each other can be determined.

In a step S130, ECU 100 estimates deviated capacity $\Delta Qs(W)$ attributed to age-related deterioration in accordance with the age-related deterioration map described in connection with FIG. 20, from positive electrode capacity retention ratio Id and negative electrode capacity retention ratio k2 obtained in step S120. In addition, in a step S140, ECU 100 separates deviated capacity $\Delta Qs$ set in step S120 into $\Delta Qs(W)$ calculated in step S120 and deviated capacity $\Delta Qs(Li)$ attributed to deposition of lithium. Namely, calculation of $\Delta Qs(Li)=\Delta Qs-\Delta Qs(W)$ is performed. Thus, $\Delta Qs(Li)$ is calculated for each battery module 15.

Then, ECU 100 determines whether or not replacement is required, with deviated capacity $\Delta Qs(Li)$ attributed to deposition of lithium and separated in step S140 serving as deterioration indicator DI. This determination as to whether or not replacement is required is based on $DI=\Delta Qs(Li)$ in steps S150 to S300 shown in FIG. 21.

In addition, in step S400 as in FIG. 7, ECU 100 generates guidance information for battery replacement. The guidance information is the same as in the first embodiment.

Thus, according to the present second embodiment, when deterioration of a lithium ion secondary battery is to be determined, deterioration for each battery module can be diagnosed by using a deterioration indicator indicating an amount of deposition of lithium. Therefore, an amount of deposition of lithium greatly affecting deterioration of the lithium ion secondary battery is quantitatively evaluated, and then battery replacement for each battery module can efficiently be carried out.

[Variation of Second Embodiment]

In a variation of the second embodiment, deterioration of a lithium ion secondary battery (battery module 15) mounted on an electrically powered vehicle is to be determined. Specifically, a method for ECU 100 to obtain deterioration parameters (k1, k2, ΔQs) based on deterioration diagnosis on-board of a car-mounted battery will be described. It is noted that, among electrically powered vehicles, a plug-in hybrid vehicle (PHV) or an electric vehicle (EV) has a configuration for charging a car-mounted battery with an external power supply as in the case of the power supply system in FIG. 1.

Figure 23:
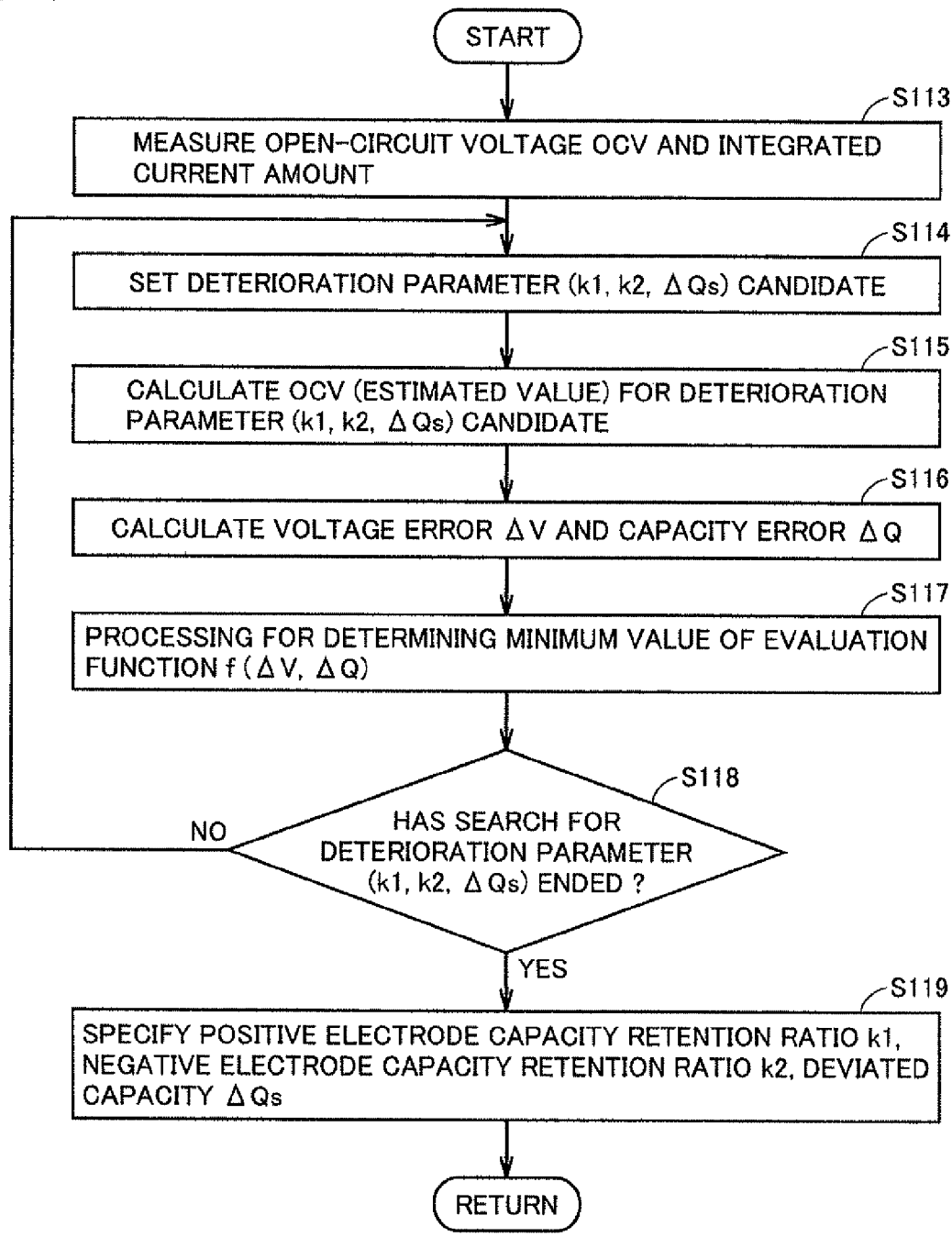
FIG. 23 is a flowchart showing a control processing procedure for obtaining on-board, a deterioration parameter of the lithium ion secondary battery which is a car-mounted battery.

FIG. 23 is a flowchart showing a control processing procedure for obtaining on-board, a deterioration parameter of the lithium ion secondary battery which is a car-mounted battery. FIG. 23 corresponds to implementation of steps S110, S120 in FIG. 21 in obtaining deterioration parameters of a car-mounted battery (lithium ion secondary battery) on-board.

In a step S113, ECU 100 measures open-circuit voltage (actually measured value) OCV and an integrated current amount of the lithium ion secondary battery (each battery module 15) based on outputs from voltage sensor 30 and current sensor 20. Specifically, by measuring as appropriate open-circuit voltage (actually measured value) OCV and an integrated current amount in charging the lithium ion secondary battery (each battery module 15) mounted on a vehicle, a curve (an open-circuit voltage curve as actually measured values) showing change in open-circuit voltage (actually measured value) OCV with change in battery capacity can be obtained. It is noted that, since voltage sensor 30 is arranged for each battery module 15, the open-circuit voltage curve can also be obtained for each battery module 15.

In a step S114, ECU 100 sets (selects) candidates for deterioration parameters (positive electrode capacity retention ratio k1, negative electrode capacity retention ratio k2, and deviated capacity ΔQs) for specifying open-circuit voltage (estimated value) OCV. The deterioration parameters can be set with various methods, however, a method for efficiently performing operation processing for setting deterioration parameters is preferably adopted.

For example, as a range of choice of deterioration parameters, a range at the time when deterioration is actually caused by age-related deterioration or deposition of lithium can be specified in advance based on experiments or the like. Here, since positive electrode capacity retention ratio k1 and negative electrode capacity retention ratio k2 are dependent only on age-related deterioration, positive electrode capacity retention ratio k1 and negative electrode capacity retention ratio k2 can be varied within a range at the time when actual age-related deterioration occurs. Then, if positive electrode capacity retention ratio k1 and negative electrode capacity retention ratio k2 can be specified, the age-related deterioration map (FIG. 20) can be used to specify deviated capacity ΔQs(W) attributed to age-related deterioration. If deviated capacity ΔQs(W) can be specified, deviated capacity ΔQs(Li) should only be varied. Then, in a step S115, ECU 100 calculates characteristics showing change in open-circuit voltage (estimated value) OCV with change in capacity (an open-circuit voltage curve as estimated values) based on the deterioration parameters set in step S114.

In a step S116, ECU 100 calculates an error between the open-circuit voltage curve (estimated value) calculated in step S115 and the open-circuit voltage curve (actually measured value) obtained in step S113. This error includes a voltage error and a capacity error.

Figure 24:
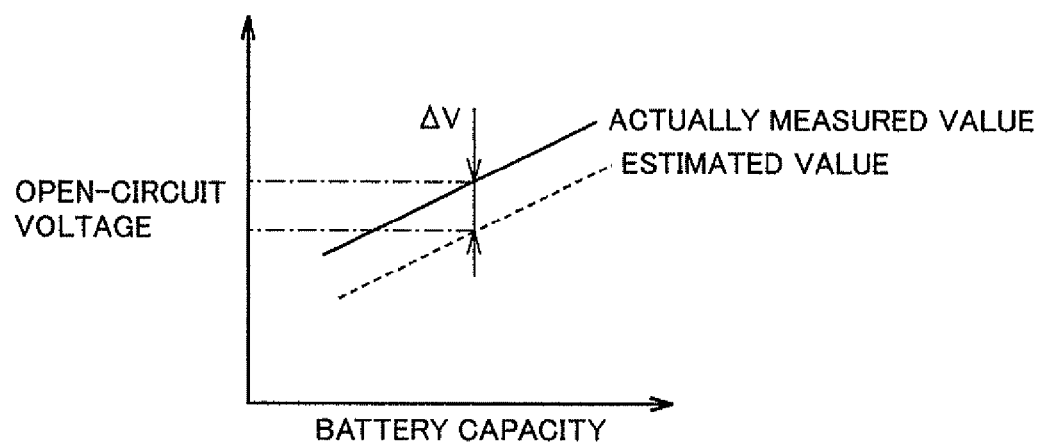
FIG. 24 is a diagram showing an error voltage between an open-circuit voltage curve (estimated value) and an open-circuit voltage curve (actually measured value).

A voltage error ΔV (see FIG. 24) can be calculated specifically by comparing the open-circuit voltage curve (estimated value) and the open-circuit voltage curve (actually measured value) with each other. Voltage error ΔV may be a voltage error in a specific battery capacity or may be an average value of voltage errors between two open-circuit voltage curves.

In addition, a capacity error ΔQ can be found, for example, with a method described below. Initially, the open-circuit voltage curve (estimated value) is used to calculate a capacity Q1 between an open-circuit voltage before charging and an open-circuit voltage after charging. Moreover, by detecting a current during a period from start to end of charging to thereby determine an integrated current value, a charge capacity Q2 can be calculated from the integrated current value. By calculating a difference between capacity Q1 and capacity Q2 described above, an absolute value (|Q1−Q2|) of capacity error ΔQ can be obtained.

Here, it is difficult to obtain an open-circuit voltage curve (actually measured value) in a hybrid car not including a charger from an external power supply. It is noted that, when the lithium ion secondary battery is in a relaxed state, several open-circuit voltages located on the open-circuit voltage curve (actually measured value) can be measured. Here, when a current flows in the lithium ion secondary battery or immediately after cut-off of a current, there is concentration difference in lithium in an active material, and therefore an accurate open-circuit voltage cannot be measured.

On the other hand, if time has elapsed since cut-off of current conduction of the lithium ion secondary battery, the lithium ion secondary battery is in the relaxed state and hence an accurate open-circuit voltage can be measured in the absence of concentration difference in lithium. The case where the lithium ion secondary battery is in the relaxed state is exemplified, for example, by a case where a vehicle remains stopped for a prescribed period of time or longer. Thus, open-circuit voltage (actually measured value) OCV at the time when the lithium ion secondary battery has a specific capacity can be obtained.

Figure 25:
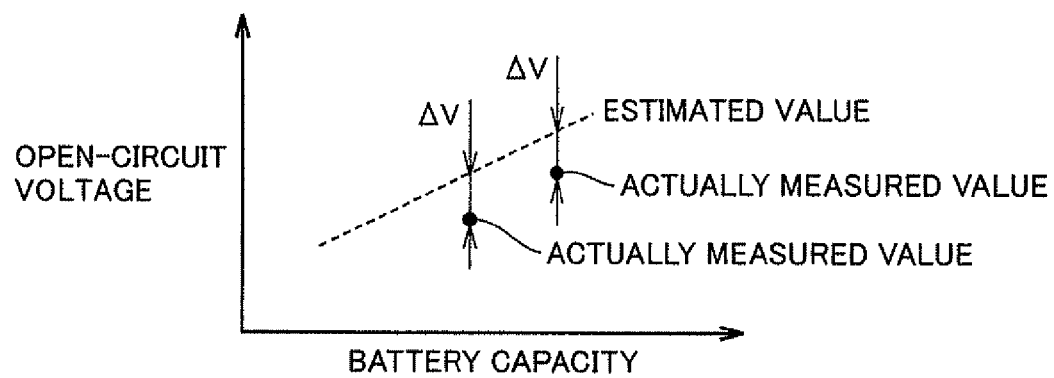
FIG. 25 is a diagram showing an error voltage between an open-circuit voltage curve (estimated value) and an open-circuit voltage.

If a specific open-circuit voltage at a specific capacity can be measured, voltage error ΔV can be found by comparing the open-circuit voltage (actually measured value) and the open-circuit voltage curve (estimated value) with each other as shown in FIG. 25. In addition, if a plurality of open-circuit voltages (actually measured values) are measured, capacity error ΔQ can be found as described above. Specifically, the open-circuit voltage curve (estimated value) is used to calculate capacity Q1 between two open-circuit voltage points (actually measured values). In addition, by measuring an integrated current value at the time when two open-circuit voltage points (actually measured values) are obtained, capacity Q2 can be calculated from this integrated current value. Then, by calculating a difference between capacity Q1 and capacity Q2 (|Q1−Q2|), an absolute value of capacity error ΔQ can be obtained.

In a step S117, ECU 100 calculates an evaluation function f(ΔV, ΔQ) in connection with voltage error ΔV and capacity error ΔQ obtained in step S116. As evaluation function f(ΔV, ΔQ), for example, a value obtained by weighted addition of voltage error ΔV and capacity error ΔQ can be employed.

In addition, ECU 100 determines whether or not evaluation function f(ΔV, ΔQ) calculated from currently set deterioration parameters is smaller than evaluation function f(ΔV, ΔQ) calculated from previously set deterioration parameters. Here, when current evaluation function f(ΔV, ΔQ) is smaller than previous evaluation function f(ΔV, ΔQ), current evaluation function f(ΔV, ΔQ) is stored in a memory.

When current evaluation function f(ΔV, ΔQ) is greater than previous evaluation function f(ΔV, ΔQ), previous evaluation function f(ΔV, ΔQ) remains stored in the memory.

In a step S118, ECU 100 determines whether or not the deterioration parameters have been varied in the entire search range. When the deterioration parameters have been varied in the entire search range, the process proceeds to a step S119. On the other hand, when it is not the case, ECU 100 returns the process to step S114.

Until the deterioration parameters are thus varied in the entire search range, the processing in steps S114 to S118 is repeatedly performed. Then, evaluation function f (ΔV, ΔQ) indicating a minimum value is specified and an open-circuit voltage curve from which this evaluation function (minimum value) was obtained can be specified. In addition, deterioration parameters (k1, k2, ΔQs) defining an open-circuit voltage curve (estimated value) can be specified. By specifying deterioration parameters with which the evaluation function indicates the minimum value, accuracy in determination of the deteriorated state (age-related deterioration and deterioration due to deposition of lithium) can be improved.

Here, specified deviated capacity ΔQs includes deviated capacity ΔQs(W) due to age-related deterioration and deviated capacity ΔQs(Li) due to deterioration caused by deposition of lithium. Therefore, in step S119, ECU 100 specifies deviated capacity ΔQs(W) attributed to age-related deterioration, by using the deterioration parameters (positive electrode capacity retention ratio k1 and negative electrode capacity retention ratio k2) determined in the processing from step S114 to step S118 and the age-related deterioration map (FIG. 20).

Then, in step S119, ECU 100 calculates deviated capacity ΔQs(Li) due to deposition of lithium by calculating a difference between deviated capacity ΔQs specified in the processing in steps S113 to S117 and deviated capacity ΔQs(W) obtained in step S119.

Thus, according to the variation of the second embodiment, for the lithium ion secondary battery (battery module 15) mounted on an electrically powered vehicle, deterioration indicator ΔQs(Li) indicating an amount of deposition of lithium can be obtained for each battery module 15. In particular, for both of a PHV and an EV having a function to externally charge the car-mounted battery with a power supply outside the vehicle and a hybrid car not including such an external charging function, deterioration indicator ΔQs(Li) can be obtained on-board based on the open-circuit voltage characteristics.

Then, an amount of deposition of lithium greatly affecting deterioration of the lithium ion secondary battery is quantitatively evaluated and then battery replacement of a car-mounted battery can efficiently be carried out.

Third Embodiment

As described in the first and second embodiments, there are a plurality of candidates for deterioration indicator DI, such as an internal resistance, a full charge capacity, and ΔQs(Li) indicating an amount of deposition of lithium. In a third embodiment, a technique for determining deterioration of a secondary battery based on combination of a plurality of deterioration indicators will be described.

Figure 26:
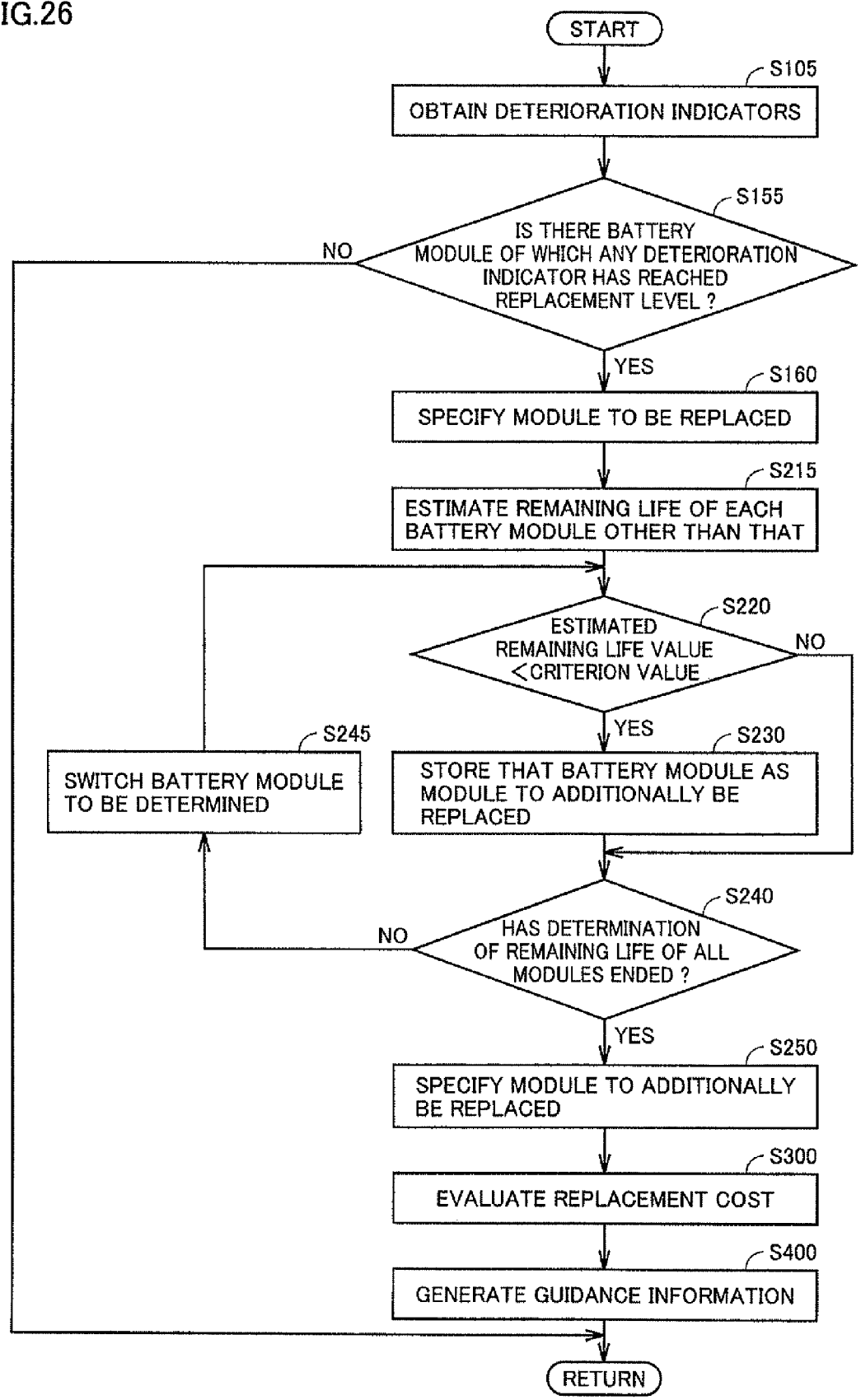
FIG. 26 is a flowchart showing a processing procedure for secondary battery deterioration determination according to a third embodiment of the present invention.

FIG. 26 is a flowchart showing a processing procedure for secondary battery deterioration determination according to the third embodiment of the present invention.

Referring to FIG. 26, in a step S105, ECU 100 obtains a plurality of deterioration indicators for each battery module 15. Step S105 is performed instead of step S100 in FIG. 7. Namely, the processing in step S105 corresponds to the function of deterioration diagnosis unit 110 in FIG. 2. For example, deterioration indicator DI includes at least two of the internal resistance, the full charge capacity, and deviated capacity ΔQs(Li) attributed to deposition of lithium described above.

In a step S155, ECU 100 determines whether or not there is a battery module 15 of which any deterioration indicator has reached the replacement level. The processing in step S155 is performed instead of step S150 in FIG. 7.

When there is a battery module 15 of which any deterioration indicator has reached the replacement level (determination as YES is made in S155), ECU 100 detects in a step S160, that battery module 15 as a module to be replaced. Namely, the processing in steps S155 and S160 corresponds to the function of detection unit 120 in FIG. 2.

On the other hand, when none of the deterioration indicators has reached the replacement level in each battery modules 15 (determination as NO is made in S155), ECU 100 ends the process without performing subsequent steps.

In succession to step S160, in a step S215, ECU 100 estimates a remaining life for each battery module 15 other than the module to be replaced.

Figure 27:
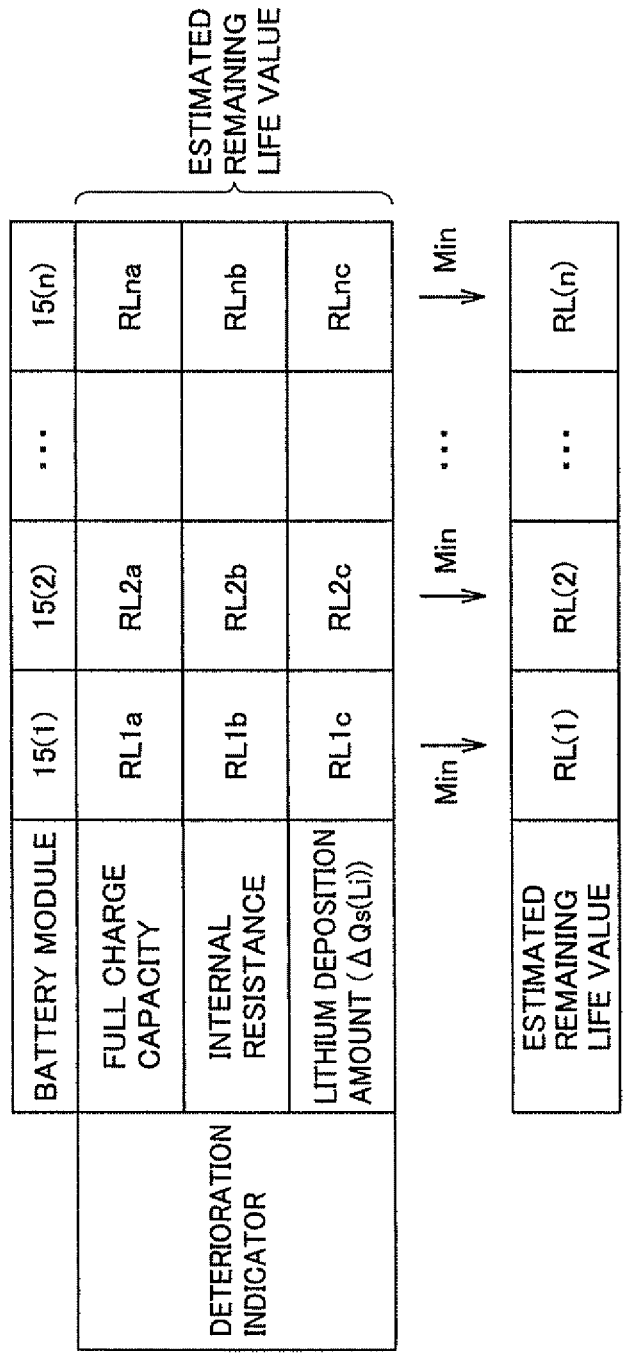
FIG. 27 is a chart illustrating calculation of an estimated remaining life value in secondary battery deterioration determination according to the third embodiment of the present invention.

Here, since a plurality of deterioration indicators have been calculated for each battery module 15, the remaining life of each battery module 15 is estimated as shown in FIG. 27.

Referring to FIG. 27, an estimated remaining life value is found in correspondence with each of the plurality of deterioration indicators, for each of battery modules 15(1) to 15(n). For example, for battery module 15(1), an estimated remaining life value RL1a until a full charge capacity reaches the replacement level, an estimated remaining life value RL1b until an internal resistance reaches the replacement level, and an estimated remaining life value RL1c until an amount of deposition of lithium reaches the replacement level are calculated. Then, a minimum value of these estimated remaining life values RL1a to RL1c is defined as estimated remaining life value RL(1) of battery module 15(1).

In step S215, a similar operation is performed also for subsequent battery modules 15(2) to (n). Thus, estimated remaining life values RL(1) to RL(n) are found for battery modules 15, respectively. Namely, the processing in step S215 corresponds to the function of remaining life estimation unit 130 in FIG. 2.

Referring again to FIG. 2, ECU 100 performs steps S220 to S250 the same as in FIG. 8. Thus, a remaining life is determined based on found estimated remaining life values RL(1) to RL(n) for each of battery modules 15 of which deterioration indicator has not currently reached the replacement level. The processing in steps S215 to S250 is performed instead of step S200 in FIG. 7.

Thus, a battery module of which remaining life until any deterioration indicator reaches the replacement level is shorter than a prescribed value among battery modules 15 other than the module to be replaced can be extracted as a module to additionally be replaced. Namely, the processing in steps S220 to S250 corresponds to the function of extraction unit 140 in FIG. 2.

In addition, in steps S300, S400, ECU 100 evaluates replacement cost and generates guidance information as in FIG. 7.

Thus, according to secondary battery deterioration determination in the third embodiment, even in the case of calculation of a plurality of deterioration indicators for each battery module 15, a battery module of which any deterioration indicator has reached the replacement level can be detected as a module to be replaced. Furthermore, by converting a plurality of deterioration indicators to remaining life estimation, the plurality of deterioration indicators are comprehensively evaluated and then a module to additionally be replaced can be extracted. Consequently, whether or not replacement is required for each battery module described above can be determined with high accuracy from various aspects by using the plurality of deterioration indicators.

Though a case where a secondary battery (lithium ion secondary battery) of which deterioration is to be determined is a secondary battery mounted on an electrically powered vehicle has been assumed in the second embodiment and the variation thereof, it is noted for the purpose of confirmation that application of the present invention is not limited to such a case. Namely, deterioration determination according to the present invention is applicable to a secondary battery of which battery can be replaced for each battery module.

In addition, though a full charge capacity, an internal resistance, and an amount of deposition of lithium have been exemplified as deterioration indicators in the present embodiment, other battery parameters can also be adopted to make secondary battery deterioration determination according to the present invention. For example, as a known parameter, a diffusion coefficient Ds of a reaction-participating material (such as lithium in a lithium ion secondary battery) described in Japanese Patent Laying-Open No. 2008-241246 (PTL 4) can be adopted as a deterioration indicator. Alternatively, positive electrode capacity retention ratio k1, negative electrode capacity retention ratio k2, deviated capacity $\Delta Qs$, and deviated capacity $\Delta Qs(W)$ attributed to age-related deterioration described in the second embodiment can also be adopted as deterioration indicators.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

This invention is applied to deterioration determination for determining whether or not a secondary battery implemented as an assembly of a plurality of battery modules should be replaced.

REFERENCE SIGNS LIST

10 secondary battery; 15 battery module; 20 current sensor; 30 voltage sensor; 40 temperature sensor; 50 load; 60 load control device; 70 charger; 75 charge connector; 80 external power supply; 85 charge plug; 100 ECU; 102 CPU; 104 memory; 110 deterioration diagnosis unit; 120 detection unit (module to be replaced); 130 remaining life estimation unit; 140 extraction unit (module to additionally be replaced); 150 guidance information generation unit; CH1 replacement level; CH2 preliminary replacement level; DI, DI(1) to DI(n) deterioration indicator; Ib battery current; RL(1) to RL(n), RL1a, RL1b, RL1c, RL1a to RL1c estimated remaining life value; Tb battery temperature; Vb battery voltage; Win input electric power upper limit value; Wout output electric power upper limit value; k1 positive electrode capacity retention ratio; k2 negative electrode capacity retention ratio; $\Delta Qs$ battery capacity fluctuation amount (deviated capacity); $\Delta Qs(Li)$ deviated capacity (attributed to deposition of lithium); and $\Delta Qs(W)$ deviated capacity (attributed to age-related deterioration).

The invention claimed is:

1. A device for determining deterioration of a battery implemented as an assembly of a plurality of battery modules, comprising:
   a deterioration diagnosis unit configured to calculate on-board a deterioration indicator quantitatively indicating a degree of deterioration for each battery module in the plurality of battery modules;
   a detection unit configured to detect on-board a deteriorated battery module to be replaced, from among said plurality of battery modules, based on a comparison between the calculated deterioration indicator of the deteriorated battery and a prescribed replacement level;
   an extraction unit configured to extract on-board, when said detection unit detects said deteriorated battery module, a nearly-deteriorated battery module to be replaced simultaneously with said deteriorated battery module, from non-deteriorated battery modules of which the deterioration indicator has not yet reached said replacement level, among said plurality of battery modules; and
   a guidance information generation unit configured to evaluate which of replacement of entire said assembly and partial replacement of only said deteriorated and nearly-deteriorated battery modules is more advantageous in terms of cost, in accordance with a total number of detected said deteriorated battery modules and extracted said nearly-deteriorated battery modules;
   wherein:
   the on-board calculation of the deterioration diagnosis unit, the on-board detection of the detection unit, and the on-board extraction of the extraction unit are executed by at least one electronic control unit mounted in the device,
   said battery is a lithium ion battery,
   said deterioration diagnosis unit includes:
      a deterioration parameter obtaining unit configured to obtain a positive electrode capacity retention ratio, a negative electrode capacity retention ratio, and a battery capacity fluctuation amount of said lithium ion battery through deterioration diagnosis based on open-circuit voltage characteristics indicating change in open-circuit voltage with change in capacity of said lithium ion battery,
      a lithium deposition amount estimation unit configured to separate the obtained battery capacity fluctuation amount into: (i) a first fluctuation amount corresponding to age-related deterioration, and (ii) a second fluctuation amount corresponding to deterioration due to deposition of lithium based on the obtained positive electrode capacity retention ratio and said negative electrode capacity retention ratio, in accordance with correspondence found in advance between said positive electrode capacity retention ratio, said negative electrode capacity retention ratio and the first fluctuation amount in said battery capacity fluctuation amount,
      said lithium deposition amount estimation unit is configured to obtain the first fluctuation amount based on the obtained positive electrode capacity retention ratio, the obtained negative electrode capacity retention ratio, and correspondence found in advance between the positive electrode capacity retention ratio, the negative electrode capacity retention ratio and the first fluctuation amount, and said lithium deposition amount estimation unit is configured to obtain said second fluctuation amount by subtracting the obtained first fluctuation amount from the obtained battery capacity fluctuation amount, and said deterioration indicator includes said second fluctuation amount of each said battery module.

2. A device for determining deterioration of a battery implemented as an assembly of a plurality of battery modules, comprising:

a deterioration diagnosis unit configured to calculate on-board a deterioration indicator quantitatively indicating a degree of deterioration for each battery module in the plurality of battery modules;

a detection unit configured to detect on-board a deteriorated battery module to be replaced, from among said plurality of battery modules, based on a comparison between the calculated deterioration indicator of the deteriorated battery and a prescribed replacement level;

an extraction unit configured to extract on-board, when said detection unit detects said deteriorated battery module, a nearly-deteriorated battery module to be replaced simultaneously with said deteriorated battery module, from non-deteriorated battery modules of which the deterioration indicator has not yet reached said replacement level, among said plurality of battery modules;

a guidance information generation unit configured to evaluate which of replacement of entire said assembly and partial replacement of only said deteriorated and nearly-deteriorated battery modules is more advantageous in terms of cost, in accordance with a total number of detected said deteriorated battery modules and extracted said nearly-deteriorated battery modules; and a remaining life estimation unit configured to estimate a remaining life until said deterioration indicator reaches said replacement level based on said deterioration indicator calculated by said deterioration diagnosis unit, for each said battery module, wherein:

the on-board calculation of the deterioration diagnosis unit, the on-board detection of the detection unit, and the on-board extraction of the extraction unit are executed by at least one electronic control unit mounted in the device, said extraction unit extracts as said nearly-deteriorated battery module, said non-deteriorated battery module among said plurality of battery modules, when estimated said remaining life is shorter than a prescribed criterion value, said deterioration diagnosis unit calculates a plurality of said deterioration indicators for each said battery module, said remaining life estimation unit estimates a plurality of said remaining lives in correspondence with said plurality of deterioration indicators, respectively, for said non-deteriorated battery modules, and carries out extraction as said nearly-deteriorated battery module when a minimum value among estimated said plurality of remaining lives is shorter than said criterion value, said battery is a lithium ion battery, said deterioration diagnosis unit includes:

a deterioration parameter obtaining unit configured to obtain a positive electrode capacity retention ratio, a negative electrode capacity retention ratio, and a battery capacity fluctuation amount of said lithium ion battery through deterioration diagnosis based on open-circuit voltage characteristics indicating change in open-circuit voltage with change in capacity of said lithium ion battery, a lithium deposition amount estimation unit configured to separate the obtained battery capacity fluctuation amount into: (i) a first fluctuation amount corresponding to age-related deterioration, and (ii) a second fluctuation amount corresponding to deterioration due to deposition of lithium based on the obtained positive electrode capacity retention ratio and said negative electrode capacity retention ratio, in accordance with correspondence found in advance between said positive electrode capacity retention ratio, said negative electrode capacity retention ratio and the first fluctuation amount in said battery capacity fluctuation amount, said lithium deposition amount estimation unit is configured to obtain the first fluctuation amount based on the obtained positive electrode capacity retention ratio, the obtained negative electrode capacity retention ratio, and correspondence found in advance between the positive electrode capacity retention ratio, the negative electrode capacity retention ratio and the first fluctuation amount, and said lithium deposition amount estimation unit is configured to obtain said second fluctuation amount by subtracting the obtained first fluctuation amount from the obtained battery capacity fluctuation amount, and said deterioration indicator includes said second fluctuation amount and at least one of an internal resistance and a full charge capacity of each said battery module.

3. A method of determining deterioration of a battery implemented as an assembly of a plurality of battery modules, comprising the steps of:

calculating on-board a deterioration indicator quantitatively indicating a degree of deterioration of a battery module for said battery module in the plurality of battery modules;

detecting on-board a deteriorated battery module to be replaced, from among said plurality of battery modules, based on a comparison between the calculated deterioration indicator and a prescribed replacement level;

extracting on-board, when said deteriorated battery module is detected, a nearly-deteriorated battery module to be replaced simultaneously with said deteriorated battery module, from non-deteriorated battery modules of which deterioration indicator has of yet reached said replacement level, among said plurality of battery modules; and evaluating which of replacement of entire said assembly and partial replacement of only said deteriorated and nearly-deteriorated battery modules is more advantageous in terms of cost, in accordance with a total number of detected said deteriorated battery modules and extracted said nearly-deteriorated battery modules, wherein:

the on-board calculation of the deterioration indicator, the on-board detection of the deteriorated battery module, and the on-board extraction of the nearly-deteriorated battery module are executed by at least one electronic control unit, said battery is a lithium ion battery, said step of calculating includes the steps of:
obtaining a positive electrode capacity retention ratio, a negative electrode capacity retention ratio, and a battery capacity fluctuation amount of said lithium ion battery through deterioration diagnosis based on open-circuit voltage characteristics indicating change in open-circuit voltage with change in capacity of said lithium ion battery,
separating obtained said battery capacity fluctuation amount into: (i) a first fluctuation amount corresponding to age-related deterioration, and (ii) a second fluctuation amount corresponding to deterioration due to deposition of lithium based on the obtained positive electrode capacity retention ratio and said negative electrode capacity retention ratio, in accordance with correspondence found in advance between said positive electrode capacity retention ratio, said negative electrode capacity retention ratio and the first fluctuation amount in said battery capacity fluctuation amount,
said first fluctuation amount is obtained based on the obtained positive electrode capacity retention ratio, the obtained negative electrode capacity retention ratio, and correspondence found in advance between the positive electrode capacity retention ratio, the negative electrode capacity retention ratio and the first fluctuation amount, and
said second fluctuation amount is obtained by subtracting the obtained first fluctuation amount from the obtained battery capacity fluctuation amount, and
said deterioration indicator includes said second fluctuation amount of each said battery module.

4. A method of determining deterioration of a battery implemented as an assembly of a plurality of battery modules, comprising the steps of:
calculating on-board a deterioration indicator quantitatively indicating a degree of deterioration of a battery module for said battery module in the plurality of battery modules;
detecting on-board a deteriorated battery module to be replaced, from among said plurality of battery modules based on a comparison between the calculated deterioration indicator and a prescribed replacement level;
extracting on-board, when said deteriorated battery module is detected, a nearly-deteriorated battery module to be replaced simultaneously with said deteriorated battery module, from non-deteriorated battery modules of which deterioration indicator has not yet reached said replacement level, among said plurality of battery modules, said step of extracting including:
estimating a remaining life until said deterioration indicator reaches said replacement level based on said deterioration indicator calculated in said step of calculating, for each said battery module, and
extracting as said nearly-deteriorated battery module, said non-deteriorated battery module among said plurality of battery modules, when estimated said remaining life is shorter than a prescribed criterion value; and
evaluating Which of replacement of entire said assembly and partial replacement of only said deteriorated and nearly-deteriorated battery modules is more advantageous in terms of cost, in accordance with a total number of detected said deteriorated battery modules and extracted said nearly-deteriorated battery modules, wherein:
the on-board calculation of the deterioration indicator, the on-board detection of the deteriorated battery module, and the on-board extraction of the nearly-deteriorated battery module are executed by at least one electronic control unit,
in said step of calculating, a plurality of said deterioration indicators are calculated for each said battery module,
in said step of estimating, a plurality of said remaining lives in correspondence with said plurality of deterioration indicators are estimated respectively, for said non-deteriorated battery module,
in said step of extracting, extraction of said nearly-deteriorated battery module is carried out when a minimum value among estimated said plurality of remaining lives is shorter than said criterion value,
said battery is a lithium ion battery,
said step of calculating includes:
obtaining a positive electrode capacity retention ratio, a negative electrode capacity retention ratio, and a battery capacity fluctuation amount of said lithium ion battery through deterioration diagnosis based on open-circuit voltage characteristics indicating change in open-circuit voltage with change in capacity of said lithium ion battery,
separating obtained said battery capacity fluctuation amount into: (i) a first fluctuation amount corresponding to age-related deterioration, and (ii) a second fluctuation amount corresponding to deterioration due to deposition of lithium based on the obtained positive electrode capacity retention ratio and said negative electrode capacity retention ratio, in accordance with correspondence found in advance between said positive electrode capacity retention ratio, said negative electrode capacity retention ratio and the first fluctuation amount in said battery capacity fluctuation amount,
said first fluctuation amount is obtained based on the obtained positive electrode capacity retention ratio, the obtained negative electrode capacity retention ratio, and correspondence found in advance between the positive electrode capacity retention ratio, the negative electrode capacity retention ratio and the first fluctuation amount, and
said second fluctuation amount is obtained by subtracting the obtained first fluctuation amount from the obtained battery capacity fluctuation amount, and
said deterioration indicator includes said second fluctuation amount and at least one of an internal resistance and a full charge capacity of each said battery module.

5. A device for determining deterioration of a battery implemented as an assembly of a plurality of battery modules, comprising:
a deterioration diagnosis unit configured to calculate on-board a deterioration indicator quantitatively indicating a degree of deterioration of a battery module for each battery module in the plurality of battery modules;
a detection unit configured to detect on-board a deteriorated battery module to be replaced, from among said plurality of battery modules, based on a comparison between the calculated deterioration indicator and a prescribed replacement level; and
an extraction unit configured to extract on-board, when said detection unit detects said deteriorated battery module, a nearly-deteriorated battery module to be replaced simultaneously with said deteriorated battery module, from non-deteriorated battery modules of which the deterioration indicator has not yet reached said replacement level, among said plurality of battery modules, said battery being a lithium ion battery, said deterioration diagnosis unit including:
- a deterioration parameter obtaining unit configured to obtain a positive electrode capacity retention ratio, a negative electrode capacity retention ratio, and a battery capacity fluctuation amount of said lithium ion battery through deterioration diagnosis based on open-circuit voltage characteristics indicating change in open-circuit voltage with change in capacity of said lithium ion battery,
- a lithium deposition amount estimation unit configured to separate the obtained battery capacity fluctuation amount into: (i) a first fluctuation amount corresponding to age-related deterioration, and (ii) a second fluctuation amount corresponding to deterioration due to deposition of lithium based on the obtained positive electrode capacity retention ratio and said negative electrode capacity retention ratio, in accordance with correspondence found in advance between said positive electrode capacity retention ratio, said negative electrode capacity retention ratio and the first fluctuation amount in said battery capacity fluctuation amount,
- said lithium deposition amount estimation unit is configured to obtain the first fluctuation amount based on the obtained positive electrode capacity retention ratio, the obtained negative electrode capacity retention ratio, and correspondence found in advance between the positive electrode capacity retention ratio, the negative electrode capacity retention ratio and the first fluctuation amount, and
- said lithium deposition amount estimation unit is configured to obtain said second fluctuation amount by subtracting the obtained first fluctuation amount from the obtained battery capacity fluctuation amount, and
- said deterioration indicator including said second fluctuation amount of each said battery module, wherein the on-board calculation of the deterioration diagnosis unit, the on-board detection of the detection unit, and the on-board extraction of the extraction unit are executed by at least one electronic control unit mounted in the device.

6. The device for determining deterioration of the battery according to claim 5, further comprising a remaining life estimation unit for estimating a remaining life until said deterioration indicator reaches said replacement level based on said deterioration indicator calculated by said deterioration diagnosis unit, for each said battery module, wherein said extraction unit extracts as said nearly-deteriorated battery module, said non-deteriorated battery module among said plurality of battery modules, when estimated said remaining life is shorter than a prescribed criterion value.

7. The device for determining deterioration of the battery according to claim 6, wherein said deterioration diagnosis unit calculates a plurality of said deterioration indicators for each said battery module, and said remaining life estimation unit estimates a plurality of said remaining lives in correspondence with said plurality of deterioration indicators, respectively, for said non-deteriorated battery modules, and carries out extraction as said nearly-deteriorated battery module when a minimum value among estimated said plurality of remaining lives is shorter than said criterion value.

8. A device for determining deterioration of the battery implemented as an assembly of a plurality of battery modules, comprising:
- a deterioration diagnosis unit configured to calculate on-board a deterioration indicator quantitatively indicating a degree of deterioration of a battery module for each battery
- a detection unit configured to detect on-board a deteriorated battery module to be replaced, from among said plurality of battery modules, based on a comparison between the calculated deterioration indicator and a prescribed replacement level;
- an extraction unit configured to extract on-board, when said detection unit detects said deteriorated battery module, a nearly-deteriorated battery module to be replaced simultaneously with said deteriorated battery module, from non-deteriorated battery modules of which the deterioration indicator has not yet reached said replacement level, among said plurality of battery modules; and
- a remaining life estimation unit configured to estimate a remaining life until said deterioration indicator reaches said replacement level based on the calculated deterioration indicator, for each said battery module,
- said extraction unit extracting as said nearly-deteriorated battery module, said non-deteriorated battery module among said plurality of battery modules, when estimated said remaining life is shorter than a prescribed criterion value,
- said deterioration diagnosis unit calculating a plurality of said deterioration indicators for each said battery module,
- said remaining life estimation unit estimating a plurality of said remaining lives in correspondence with said plurality of deterioration indicators, respectively, for said non-deteriorated battery modules, and carrying out extraction as said nearly-deteriorated battery module when a minimum value among estimated said plurality of remaining lives is shorter than said criterion value, said battery being a lithium ion battery, said deterioration diagnosis unit including:
- a deterioration parameter obtaining unit configured to obtain a positive electrode capacity retention ratio, a negative electrode capacity retention ratio, and a battery capacity fluctuation amount of said lithium ion battery through deterioration diagnosis based on open-circuit voltage characteristics indicating change in open-circuit voltage with change in capacity of said lithium ion battery,
- a lithium deposition amount estimation unit configured to separate the obtained battery capacity fluctuation amount into: (i) a first fluctuation amount corresponding to age-related deterioration, and (ii) a second fluctuation amount corresponding to deterioration due to deposition of lithium based on the obtained positive electrode capacity retention ratio and said negative electrode capacity retention ratio, in accordance with correspondence found in advance between said positive electrode capacity retention ratio, said negative electrode capacity retention ratio and the first fluctuation amount in said battery capacity fluctuation amount,
- said lithium deposition amount estimation unit is configured to obtain the first fluctuation amount based on the obtained positive electrode capacity retention ratio, the obtained negative electrode capacity retention ratio, and correspondence found in advance between the positive electrode capacity retention ratio, the negative electrode capacity retention ratio and the first fluctuation amount, and said lithium deposition amount estimation unit is configured to obtain said second fluctuation amount by subtracting the obtained first fluctuation amount from the obtained battery capacity fluctuation amount, and said deterioration indicator including said second fluctuation amount and at least one of an internal resistance and a full charge capacity of each said battery module, wherein the on-board calculation of the deterioration diagnosis unit, the on-board detection of the detection unit, and the on-board extraction of the extraction unit are executed by at least one electronic control unit mounted in the device.

9. A method of determining deterioration of a battery implemented as an assembly of a plurality of battery modules, comprising the steps of:

calculating on-board a deterioration indicator quantitatively indicating a degree of deterioration of a battery module for each battery module in the plurality of battery modules;

detecting on-board a deteriorated battery module to be replaced, from among said plurality of battery modules, based on a comparison between the calculated deterioration indicator and a prescribed replacement level; and extracting on-board, when said deteriorated battery module is detected, a nearly-deteriorated battery module to be replaced simultaneously with said deteriorated battery module, from non-deteriorated battery modules of which deterioration indicator has not yet reached said replacement level, among said plurality of battery modules, said battery being a lithium ion battery, said step of calculating including the steps of:

obtaining a positive electrode capacity retention ratio, a negative electrode capacity retention ratio, and a battery capacity fluctuation amount of said lithium ion battery through deterioration diagnosis based on open-circuit voltage characteristics indicating change in open-circuit voltage with change in capacity of said lithium ion battery, separating obtained said battery capacity fluctuation amount into: (i) a first fluctuation amount corresponding to age-related deterioration, and (ii) a second fluctuation amount corresponding to deterioration due to deposition of lithium based on the obtained positive electrode capacity retention ratio and said negative electrode capacity retention ratio, in accordance with correspondence found in advance between said positive electrode capacity retention ratio, said negative electrode capacity retention ratio and the first fluctuation amount in said battery capacity fluctuation amount, said first fluctuation amount is obtained based on the obtained positive electrode capacity retention ratio, the obtained negative electrode capacity retention ratio, and correspondence found in advance between the positive electrode capacity retention ratio, the negative electrode capacity retention ratio and the first fluctuation amount, and said second fluctuation amount is obtained by subtracting the obtained first fluctuation amount from the obtained battery capacity fluctuation amount, and said deterioration indicator including said second fluctuation amount of each said battery module.

10. The method of determining deterioration of the battery according to claim 9, wherein said step of extracting includes the steps of estimating a remaining life until said deterioration indicator reaches said replacement level based on said deterioration indicator calculated in said step of calculating, for each said battery module, and extracting as said nearly-deteriorated battery module, said non-deteriorated battery module among said plurality of battery modules, when estimated said remaining life is shorter than a prescribed criterion value.

11. The method of determining deterioration of the battery according to claim 10, wherein in said step of calculating, a plurality of said deterioration indicators are calculated for each said battery module, in said step of estimating a plurality of said remaining lives in correspondence with said plurality of deterioration indicators are estimated respectively, for said non-deteriorated battery module, and in said step of extracting, extraction as said nearly-deteriorated battery module is carried out when a minimum value among estimated said plurality of remaining lives is shorter than said criterion value.

12. A method of determining deterioration of the battery implemented as an assembly of a plurality of battery modules, comprising the steps of:

calculating on-board a deterioration indicator quantitatively indicating a degree of deterioration of a battery module for each said battery module;

detecting on-board a deteriorated battery module to be replaced, from among said plurality of battery modules, based on a comparison between the calculated deterioration indicator and a prescribed replacement level; and extracting on-board, when said deteriorated battery module is detected, a nearly-deteriorated battery module to be replaced simultaneously with said deteriorated battery module, from non-deteriorated battery modules of which deterioration indicator has not yet reached said replacement level, among said plurality of battery modules, said step of extracting including the steps of:

estimating a remaining life until said deterioration indicator reaches said replacement level based on said deterioration indicator calculated in said step of calculating, for each said battery module, and extracting as said nearly-deteriorated battery module, said non-deteriorated battery module among said plurality of battery modules, when estimated said remaining life is shorter than a prescribed criterion value, in said step of calculating, a plurality of said deterioration indicators being calculated for each said battery module, in said step of estimating, a plurality of said remaining lives in correspondence with said plurality of deterioration indicators being estimated respectively, for said non-deteriorated battery module, in said step of extracting, extraction as said nearly-deteriorated battery module being carried out when a minimum value among estimated said plurality of remaining lives is shorter than said criterion value, said battery being a lithium ion battery,
said step of calculating including the steps of:
obtaining a positive electrode capacity retention ratio, a negative electrode capacity retention ratio, and a battery capacity fluctuation amount of said lithium ion battery through deterioration diagnosis based on open-circuit voltage characteristics indicating change in open-circuit voltage with change in capacity of said lithium ion battery,
separating obtained said battery capacity fluctuation amount into: (i) a first fluctuation amount corresponding to age-related deterioration, and (ii) a second fluctuation amount corresponding to deterioration due to deposition of lithium based on the obtained positive electrode capacity retention ratio and said negative electrode capacity retention ratio, in accordance with correspondence found in advance between said positive electrode capacity retention ratio, said negative electrode capacity retention ratio and the first fluctuation amount in said battery capacity fluctuation amount,
said first fluctuation amount is obtained based on the obtained positive electrode capacity retention ratio, the obtained negative electrode capacity retention ratio, and correspondence found in advance between the positive electrode capacity retention ratio, the negative electrode capacity retention ratio and the first fluctuation amount, and
said second fluctuation amount is obtained by subtracting the obtained first fluctuation amount from the obtained battery capacity fluctuation amount, and
said deterioration indicator including said second fluctuation amount and at least one of an internal resistance and a full charge capacity of each said battery module, wherein
the on-board calculation of the deterioration indicator, the on-board detection of the deteriorated battery module, and the on-board extraction of the nearly-deteriorated battery module are executed by at least one electronic control unit.

13. A device for determining deterioration of a battery implemented as an assembly of a plurality of battery modules, comprising:
an electronic control unit configured to:
calculate on-board a deterioration indicator quantitatively indicating a degree of deterioration for each battery module in the plurality of battery modules;
detect on-board a deteriorated battery module to be replaced, from among said plurality of battery modules, based on a comparison between the calculated deterioration indicator and a prescribed replacement level;
extract on-board, when said deteriorated battery module is detected, a nearly-deteriorated battery module to be replaced simultaneously with said deteriorated battery module, from non-deteriorated battery modules of which the deterioration indicator has not yet reached said replacement level, among said plurality of battery modules; and
evaluate which of replacement of entire said assembly and partial replacement of only said deteriorated and nearly-deteriorated battery modules is more advantageous in terms of cost, in accordance with a total number of detected said deteriorated battery modules and extracted said nearly-deteriorated battery modules, wherein:
said battery is a lithium ion battery,
said detection of the deteriorated battery module includes:
obtaining a positive electrode capacity retention ratio, a negative electrode capacity retention ratio, and a battery capacity fluctuation amount of said lithium ion battery through deterioration diagnosis based on open-circuit voltage characteristics indicating change in open-circuit voltage with change in capacity of said lithium on battery,
separating the obtained battery capacity fluctuation amount into (i) a first fluctuation amount corresponding to age-related deterioration, and (ii) a second fluctuation amount corresponding to deterioration due to deposition of lithium based on the obtained positive electrode capacity retention ratio and said negative electrode capacity retention ratio in accordance with correspondence found in advance between said positive electrode capacity retention ratio, said negative electrode capacity retention ratio and the first fluctuation amount in said battery capacity fluctuation amount,
said first fluctuation amount is obtained based on the obtained positive electrode capacity retention ratio, the obtained negative electrode capacity retention ratio, and correspondence found in advance between the positive electrode capacity retention ratio, the negative electrode capacity retention ratio and the first fluctuation amount, and
said second fluctuation amount is obtained by subtracting the obtained first fluctuation amount from the obtained battery capacity fluctuation amount, and
said deterioration indicator includes said second fluctuation amount of each battery module.

* * * * *